(12) United States Patent
Huang

(10) Patent No.: US 12,424,556 B2
(45) Date of Patent: Sep. 23, 2025

(54) SEMICONDUCTOR DEVICE WITH ADJUSTMENT LAYERS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/596,978

(22) Filed: Mar. 6, 2024

(65) Prior Publication Data
US 2024/0213162 A1 Jun. 27, 2024

Related U.S. Application Data

(62) Division of application No. 17/698,564, filed on Mar. 18, 2022, which is a division of application No. 16/895,620, filed on Jun. 8, 2020, now abandoned.

(51) Int. Cl.
*H01L 21/768* (2006.01)
*H01L 23/532* (2006.01)
*H10B 12/00* (2023.01)

(52) U.S. Cl.
CPC .... *H01L 23/53295* (2013.01); *H01L 21/7682* (2013.01); *H01L 21/76831* (2013.01); *H01L 21/76844* (2013.01); *H01L 21/76846* (2013.01); *H10B 12/0335* (2023.02); *H10B 12/315* (2023.02); *H01L 21/76843* (2013.01)

(58) Field of Classification Search
CPC ......... H01L 21/7682; H01L 21/76829–76831; H01L 21/76843–76846; H01L 23/53295
See application file for complete search history.

(56) References Cited

U.S. PATENT DOCUMENTS

| 5,534,463 | A | 7/1996 | Lee et al. |
| 7,348,617 | B2 | 3/2008 | Kumura et al. |
| 7,470,612 | B2 * | 12/2008 | Choi ................. H01L 21/76876 257/E21.627 |

(Continued)

OTHER PUBLICATIONS

Office Action and and the search report mailed on May 9, 2024 related to U.S. Appl. No. 17/698,564, wherein this application is a Div of U.S. Appl. No. 17/698,564.

(Continued)

*Primary Examiner* — Daniel Luke
(74) *Attorney, Agent, or Firm* — Xuan Zhang

(57) ABSTRACT

The present application discloses a semiconductor device with adjustment layers and a method for fabricating the semiconductor device with the adjustment layers. The semiconductor device includes a substrate, an interconnection structure positioned on the substrate, a contact positioned penetrating the interconnection structure, two adjustment layers positioned on sidewalls of the contact, a contact barrier layer positioned between the interconnection structure and the contact and between the substrate and the contact, wherein the two adjustment layers are positioned between the contact and the contact barrier layer. A bottom segment of the contact barrier layer is positioned between the substrate and the contact, and bottom most points of the two adjustment layers contact the bottom portion of the contact barrier layer.

9 Claims, 32 Drawing Sheets

(56) References Cited

U.S. PATENT DOCUMENTS

| | | | | |
|---|---|---|---|---|
| 7,602,061 | B2* | 10/2009 | Kagawa | ............ H01L 21/76835 |
| | | | | 257/734 |
| 9,142,451 | B2* | 9/2015 | Singh | .................... H01L 23/528 |
| 9,406,589 | B2* | 8/2016 | Ting | .................. H01L 21/76814 |
| 9,449,921 | B1* | 9/2016 | Basker | ................ H01L 23/5283 |
| 9,754,829 | B2 | 9/2017 | Hosler et al. | |
| 9,911,651 | B1* | 3/2018 | Briggs | .............. H01L 21/76811 |
| 9,953,863 | B1 | 4/2018 | Ho et al. | |
| 10,049,980 | B1 | 8/2018 | Adusumilli et al. | |
| 10,217,705 | B1* | 2/2019 | Qian | .................. H01L 21/76816 |
| 10,685,870 | B2 | 6/2020 | Hsu et al. | |
| 11,101,171 | B2* | 8/2021 | Zhang | ................ H01L 21/76807 |
| 11,929,329 | B2 | 3/2024 | Chou et al. | |
| 2010/0230815 | A1* | 9/2010 | Tsao | .................... H01L 23/5226 |
| | | | | 257/E23.145 |
| 2010/0314777 | A1* | 12/2010 | Oda | .................. H01L 23/53295 |
| | | | | 257/E21.585 |
| 2011/0108987 | A1* | 5/2011 | Tomizawa | ........ H01L 21/76846 |
| | | | | 257/E23.154 |
| 2011/0204525 | A1* | 8/2011 | Seo | .................... H01L 21/76807 |
| | | | | 438/618 |
| 2019/0259855 | A1 | 8/2019 | Cheng et al. | |

OTHER PUBLICATIONS

Office Action and and the search report mailed on Mar. 20, 2025 related to U.S. Appl. No. 17/698,564, wherein this application is a Div of U.S. Appl. No. 17/698,564.

* cited by examiner

SEMICONDUCTOR DEVICE WITH ADJUSTMENT LAYERS AND METHOD FOR FABRICATING THE SAME

CROSS-REFERENCE TO RELATED APPLICATION

This application is a divisional application of U.S. Non-Provisional application Ser. No. 17/698,564 filed Mar. 18, 2022, which is a divisional application of U.S. Non-Provisional application Ser. No. 16/895,620 filed Jun. 8, 2020. The entirety of the above-mentioned patent application is hereby incorporated by reference herein and made a part of this specification.

TECHNICAL FIELD

The present disclosure relates to a semiconductor device and a method for fabricating the semiconductor device, and more particularly, to a semiconductor device with adjustment layers and a method for fabricating the semiconductor device with the adjustment layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, an interconnection structure positioned on the substrate, a contact positioned penetrating the interconnection structure, and two adjustment layers positioned on sidewalls of the contact.

In some embodiments, a thickness of the adjustment layers gradually decrease toward the substrate.

In some embodiments, a thickness of top surfaces of the two adjustment layers is between about 1 angstrom and about 30 angstroms.

In some embodiments, an aspect ratio of the contact is between about 1:3 and about 1:15.

In some embodiments, the semiconductor device includes a contact barrier layer positioned between the interconnection structure and the contact and between the substrate and the contact, wherein the two adjustment layers are positioned between the contact and the contact barrier layer.

In some embodiments, a bottom segment of the contact barrier layer is positioned between the substrate and the contact, and bottom most points of the two adjustment layers contact the bottom portion of the contact barrier layer.

In some embodiments, a thickness of the contact barrier layer is between about 10 angstroms and about 15 angstroms.

In some embodiments, the interconnection structure includes a first liner layer positioned on the substrate, a first insulating layer positioned on the first liner layer, a second liner layer positioned on the first insulating layer, and a second insulating layer positioned on the second liner layer, and the contact positioned penetrating the second insulating layer, the second liner layer, the first insulating layer, and the first liner layer.

In some embodiments, bottom most points of the two adjustment layers are at a vertical level lower than a vertical level of the second liner layer.

In some embodiments, a dielectric constant of the first insulating layer is equal to or less than 3.0.

In some embodiments, the first insulating layer is porous.

In some embodiments, a porosity of the first insulating layer is between about 15% and about 50%.

In some embodiments, the two adjustment layers are formed of metal oxide, metal nitride, or metal carbide.

In some embodiments, an angle between a top surface of the contact and one of the sidewalls of the contact is between about 83 degree and about 90 degree.

Another aspect of the present disclosure provides a method for fabricating a semiconductor device including providing a substrate, forming an interconnection structure on the substrate, forming a contact opening penetrating the interconnection structure, conformally forming a contact barrier layer in the contact opening, conformally forming adjustment layers covering upper portions of the contact barrier layer, and forming a contact in the contact opening.

In some embodiments, the adjustment layers are formed of metal oxide, metal nitride, or metal carbide.

In some embodiments, the step of forming the interconnection structure on the substrate includes forming a first liner layer on the substrate, forming a first insulating layer on the first liner layer, forming a second liner layer on the first insulating layer, and forming a second insulating layer on the second liner layer. The contact opening is formed penetrating the second insulating layer, the second liner layer, the first insulating layer, and the first liner layer.

In some embodiments, the step of forming the first insulating layer on the first liner layer includes forming a layer of energy-removable material on the first liner layer, and performing an energy treatment to turn the layer of energy-removable material into the first insulating layer. A porosity of the first insulating layer is between about 15% and about 50%.

In some embodiments, an energy source of the energy treatment is heat, light, or a combination thereof.

In some embodiments, the layer of energy-removable material includes a base material and a decomposable porogen material.

Due to the design of the semiconductor device of the present disclosure, the contact structure may be formed without any void. Therefore, the yield of the semiconductor device may be improved. In addition, the porosity of the first insulating layer may reduce the parasitic capacitance of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
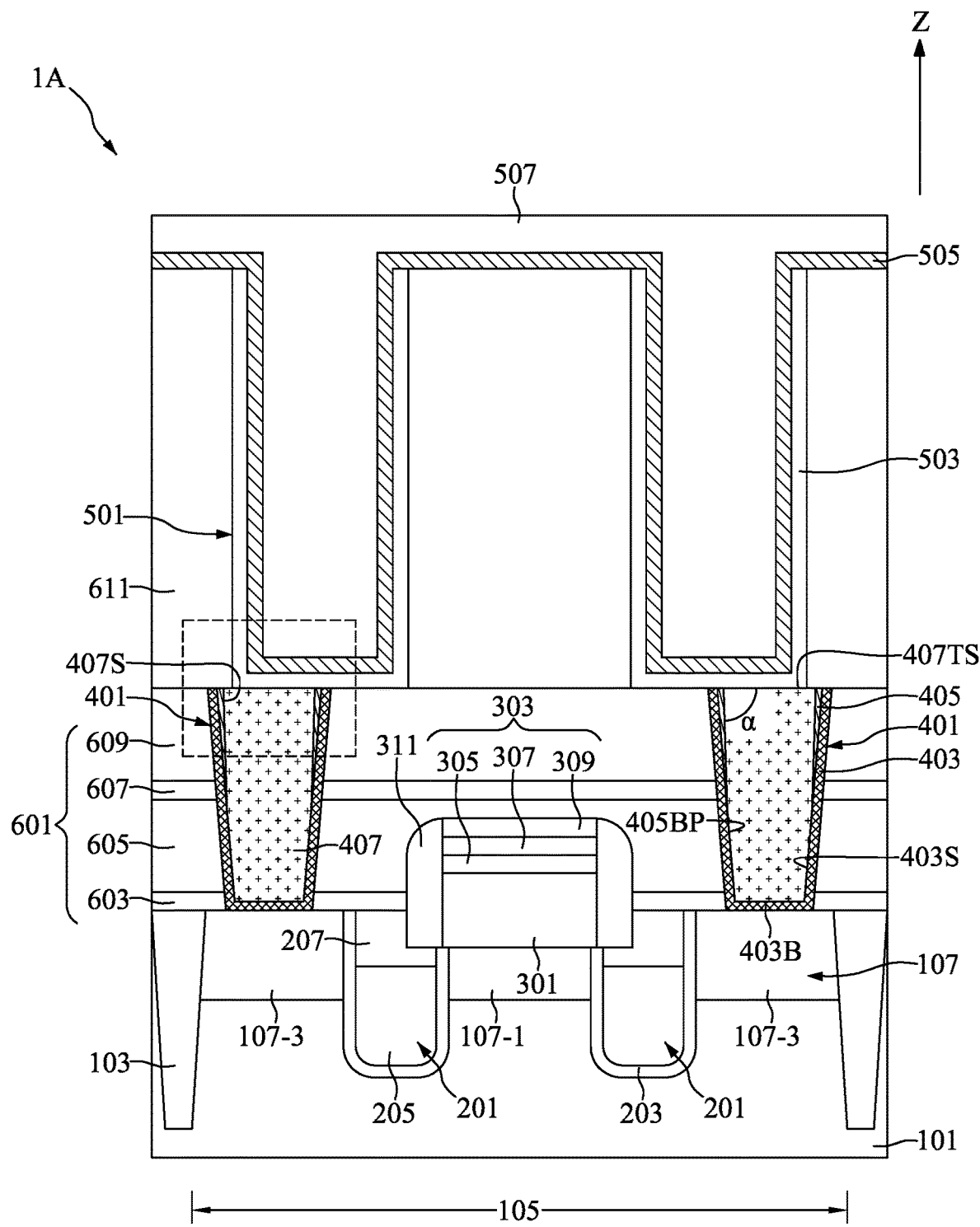
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

It should be noted that, in the description of the present disclosure, above (or up) corresponds to the direction of the arrow of the direction Z, and below (or down) corresponds to the opposite direction of the arrow of the direction Z.

Figure 2:
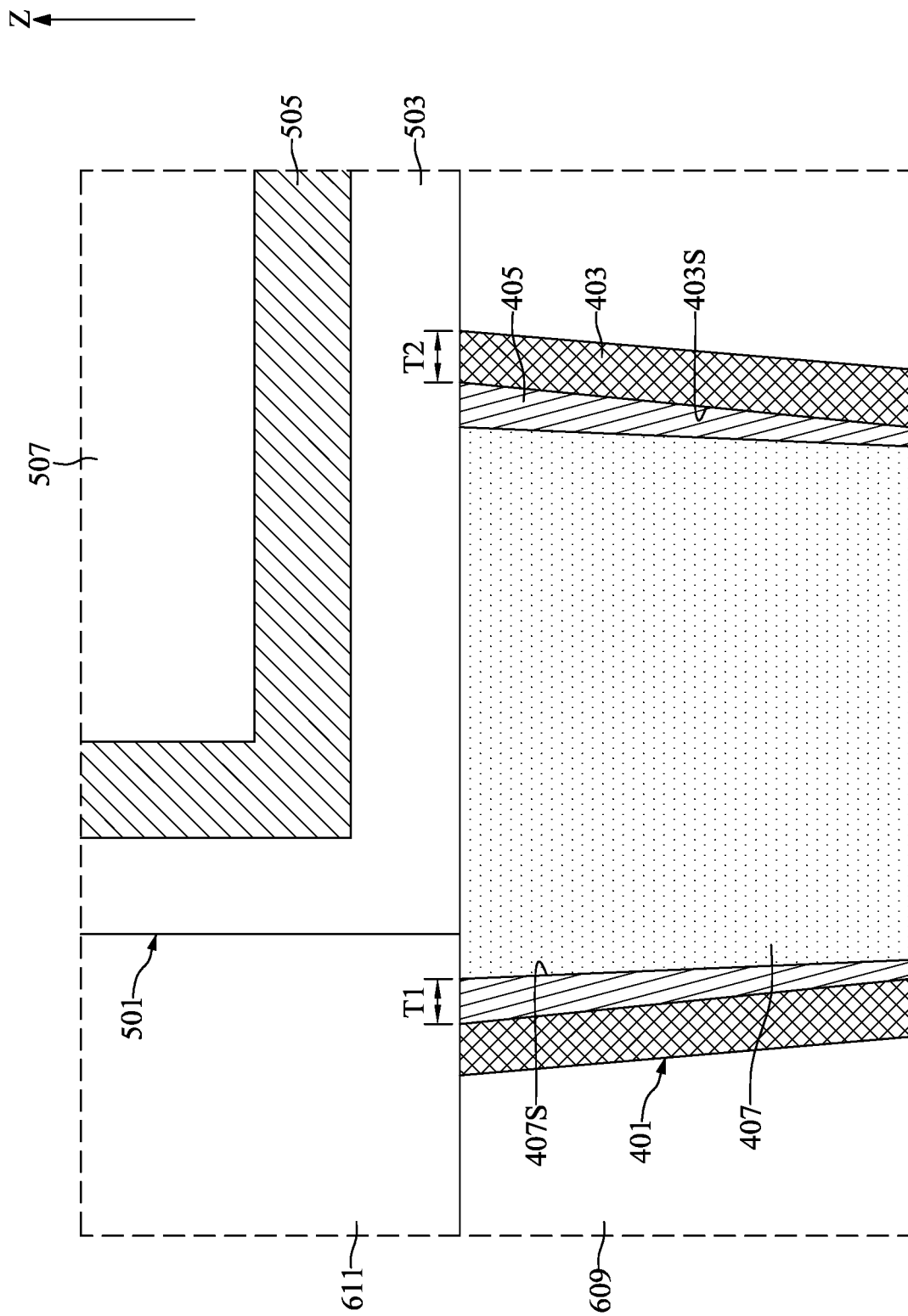
FIG. 2 illustrates, in an enlarged schematic cross-sectional diagram, part of the semiconductor device in accordance with one embodiment of the present disclosure.

FIG. 1 illustrates, in a schematic cross-sectional diagram, a semiconductor device 1A in accordance with one embodiment of the present disclosure. FIG. 2 illustrates, in an enlarged schematic cross-sectional diagram, part of the semiconductor device 1A in accordance with one embodiment of the present disclosure.

With reference to FIGS. 1 and 2, the semiconductor device 1A may include a substrate 101, an isolation layer 103, impurity regions 107, two word line structures 201, a bit line contact 301, a bit line structure 303, two bit line spacers 311, two contact structures 401, capacitor structures 501, an interconnection structure 601, and a third insulating layer 611.

With reference to FIGS. 1 and 2, the substrate 101 may be formed of for example, silicon, germanium, silicon germanium, silicon carbon, silicon germanium carbon, gallium, gallium arsenide, indium arsenide, indium phosphorus or other IV-IV, III-V or II-VI semiconductor materials.

With reference to FIGS. 1 and 2, the isolation layer 103 may be disposed in an upper portion of the substrate 101. The isolation layer 103 may be formed of, for example, an insulating material such as silicon oxide, silicon nitride, silicon oxynitride, silicon nitride oxide, or fluoride-doped silicate. The isolation layer 103 may define an active area 105 of the substrate 101. The active area 105 may be disposed between the isolation layer 103.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 and 2, the two word line structures 201 may be disposed in the upper portion of the active area 105. Each of the two word line structures 201 may include a word line dielectric layer 203, a word line electrode 205, and a word line capping layer 207. For convenience of description, only one word line structure 201 is described.

With reference to FIGS. 1 and 2, the word line dielectric layer 203 may be inwardly disposed in the upper portion of active area 105. The word line dielectric layer 203 may be formed of an insulating material having a dielectric constant of about 4.0 or greater. (All dielectric constants mentioned herein are relative to a vacuum unless otherwise noted.). The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like. The word line dielectric layer 203 may have a thickness between about 0.5 nm and about 10 nm.

With reference to FIGS. 1 and 2, the word line electrode 205 may be disposed on the word line dielectric layer 203. The word line electrode 205 may be formed of a conductive material such as doped polysilicon, silicon germanium, metal, metal alloy, metal silicide, metal nitride, metal carbide, or a combination including multilayers thereof. When multilayers are present, a diffusion barrier layer (not shown) such as titanium nitride or tantalum nitride may be disposed between each of the multilayers. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. The word line electrode 205 may have a thickness between about 50 nm and about 500 nm. In some embodiments, a word line barrier layer (not shown) may be disposed between the word line dielectric layer 203 and the word line electrode 205. The word line barrier layer may be formed of, for example, titanium, titanium nitride, titanium silicon nitride, tantalum, tantalum nitride, tantalum silicon nitride, and combination thereof. The word line barrier layer may be employed to prevent the word line electrode 205 from flaking or spalling from the word line dielectric layer 203.

With reference to FIGS. 1 and 2, the word line capping layer 207 may be disposed on the word line electrode 205. The top surface of the word line capping layer 207 may be even with the top surface of the substrate 101. The word line capping layer 207 may be formed of, for example, silicon oxide, silicon nitride, silicon oxynitride, silicon nitride oxide, fluoride-doped silicate, or the like. In some embodiments, the word line capping layer 207 may be formed of a stacked layer including a bottom capping layer (not shown) and a top capping layer (not shown). The bottom capping layer may be disposed on the word line electrode 205. The top capping layer may be disposed on the bottom capping layer. The bottom capping layer may be formed of an insulating material having a dielectric constant of about 4.0 or greater. The top capping layer may be formed of a low dielectric-constant material such as silicon oxide, fluoride-doped silicate, or the like. The top capping layer formed of the low dielectric-constant material may reduce electric field at the top surface of the substrate 101; therefore, leakage current may be reduced.

With reference to FIGS. 1 and 2, the impurity regions 107 may be disposed in the active area 105 of the substrate 101. The impurity regions 107 may be doped with a dopant such as phosphorus, arsenic, or antimony. The impurity regions 107 may include a first impurity region 107-1 and two second impurity regions 107-3. The first impurity region 107-1 may be disposed between the two word line structures 201. The two second impurity region 107-3 may be disposed between the two word line structures 201 and the isolation layer 103.

With reference to FIGS. 1 and 2, the interconnection structure 601 may be disposed on the substrate 101. The interconnection structure 601 may include a first liner layer 603, a first insulating layer 605, a second liner layer 607, and a second insulating layer 609. The first liner layer 603 may be disposed on the substrate 101. The first liner layer 603 may be a stacked layer or a single layer including silicon oxide, silicon nitride, silicon oxynitride, silicon nitride oxide, fluoride-doped silicate, or the like. The first insulating layer 605 may be disposed on the first liner layer 603. The second liner layer 607 may be disposed on the first insulating layer 605. The second insulating layer 609 may be disposed on the second liner layer 607. The first insulating layer 605 and the second insulating layer 609 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, or a combination thereof, but are not limited thereto. The first insulating layer 605 and the second insulating layer 609 may be formed of a same material but are not limited thereto. The second liner layer 607 and the first liner layer 603 may be formed of a same material but are not limited thereto. In some embodiments, the first liner layer 603 and the second liner layer 607 may be serve as etch stop layers.

With reference to FIGS. 1 and 2, the bit line contact 301 may be disposed in the substrate 101 and the first liner layer 603. Specifically, a lower portion of the bit line contact 301 may be buried in an upper portion of the first impurity region 107-1. An upper portion of the bit line contact 301 may be disposed in the first liner layer 603. The top surface of the bit line contact 301 may be even with the top surface of the first liner layer 603. The bit line contact 301 may be formed of, for example, doped polysilicon, a metal, or a metal silicide. The bit line contact 301 may be electrically connected to the first impurity region 107-1.

With reference to FIGS. 1 and 2, the bit line structure 303 may be disposed in the first insulating layer 605 and disposed on the bit line contact 301. The bit line structure 303 may include a bit line bottom conductive layer 305, a bit line top conductive layer 307, and a bit line capping layer 309. The bit line bottom conductive layer 305 may be disposed on the bit line contact 301 and electrically connected to the bit line contact 301. The bit line bottom conductive layer 305 may be formed of, for example, doped polysilicon. The bit line top conductive layer 307 may be disposed on the bit line bottom conductive layer 305 and electrically connected to the bit line bottom conductive layer 305. The bit line top conductive layer 307 may be formed of, for example, copper, nickel, cobalt, aluminum, or tungsten. The bit line capping layer 309 may be disposed on the bit line top conductive layer 307. The bit line capping layer 309 may be formed of, for example, silicon oxide or silicon nitride.

With reference to FIGS. 1 and 2, the two bit line spacers 311 may be disposed in the first insulating layer 605, the first liner layer 603, and the substrate 101. Specifically, the two bit line spacers 311 may be respectively correspondingly attached to sidewalls of the bit line capping layer 309, sidewalls of the bit line top conductive layer 307, sidewalls of the bit line bottom conductive layer 305, and sidewalls of the bit line contact 301. That is to say, the sidewalls of the bit line capping layer 309, the bit line top conductive layer 307, and the bit line bottom conductive layer 305 may be distanced from the first insulating layer 605, and the sidewalls of the bit line contact 301 may be distanced from the first liner layer 603. In some embodiments, the bottom portions of the two bit line spacers 311 may be buried in the substrate 101. The bottom portions of the two bit line spacers 311 may be disposed on portions of the word line dielectric layer 203 and portions of the word line capping layer 207. The two bit line spacers 311 may be formed of, for example, silicon oxide, silicon nitride, silicon oxynitride, or silicon nitride oxide. Alternatively, in some embodiments, the bottom portions of the two bit line spacers 311 may be only buried in the first impurity region 107-1 and may be distanced from the two word line structures 201.

With reference to FIGS. 1 and 2, the two contact structures 401 may be disposed in the interconnection structure 601. The two contact structures 401 may be respectively correspondingly disposed on the two second impurity region 107-3. Each of the two contact structures 401 may include a contact barrier layer 403, adjustment layers 405, and a contact 407. For convenience of description, only one contact structures 401 is described.

With reference to FIGS. 1 and 2, the contact 407 may be disposed penetrating the second insulating layer 609, the second liner layer 607, the first insulating layer 605, and the first liner layer 603. In some embodiments, the sidewalls of the contact 407 may have a slanted cross-sectional profile. In some embodiments, a width of the contact 407 may gradually become wider from bottom to top along the direction Z. In some embodiments, an angle between the top surface 407TS of the contact 407 and the sidewall 407S of the contact 407 may be between 83 degree and about 90 degree. The contact 407 may be formed of, for example, doped polysilicon, titanium, titanium nitride, tantalum, tantalum nitride, tungsten, copper, aluminum or aluminum alloy. The contact 407 may be electrically coupled to the second impurity region 107-3. In some embodiments, an aspect ratio of the contact is between about 1:3 and about 1:15. The aspect ratio of the contact 407 may be defined by a ratio of the width of the top surface 407TS of the contact 407 and the thickness of the contact 407.

With reference to FIGS. 1 and 2, the adjustment layers 405 may be respectively correspondingly disposed on the sidewalls 407S of the contact 407. The adjustment layers 405 may be disposed between the interconnection structure 601 and the contact 407. Specifically, the adjustment layers 405 may be respectively correspondingly disposed on upper portions of the sidewalls 407S of the contact 407. In some embodiments, a thickness T1 of the top surfaces of the adjustment layers 405 is between about 1 angstrom and about 30 angstroms. In some embodiments, a thickness of the adjustment layers 405 gradually decrease along the direction Z toward the substrate 101. In some embodiments, the bottom most point 405BP of the adjustment layers 405 may be at a vertical level lower than a vertical level of the second liner layer 607. In some embodiments, the bottom most point 405BP of the adjustment layers 405 may be at a vertical level higher than a vertical level of the second liner layer 607. In some embodiments, the bottom most point 405BP of the adjustment layers 405 may be at a vertical level even with a vertical level of the second liner layer 607.

In some embodiments, the adjustment layers 405 may be formed of any suitable metal, metal oxide, metal carbide, metal nitride, or combination thereof. For example, the adjustment layers 405 may be formed of aluminum carbide, aluminum nitride, tungsten carbide, or tungsten nitride. In some embodiments, the adjustment layers 405 may be formed of, for example, aluminum oxide, hafnium oxide, zirconium oxide, titanium oxide, titanium nitride, tungsten nitride, silicon nitride, or silicon oxide.

With reference to FIGS. 1 and 2, the contact barrier layer 403 may be disposed between the interconnection structure 601 and the contact 407 and between the substrate 101 and the contact 407. Specifically, the contact barrier layer 403 may include a bottom segment 403B and side segments 403S. The bottom segment 403B may be disposed on the substrate 101. The bottom segment 403B may be disposed between the substrate 101 and the contact 407. The side segments 403S may connect to the two ends of the bottom segment 403B. The side segments 403S may be disposed between the interconnection structure 601 and the contact 407. The adjustment layers 405 may be disposed between the contact 407 and the side segments 403S. The adjustment layers 405 may be only attached on the upper portions of the side segments 403S. The contact barrier layer 403 may have a thickness T2 between about 10 angstroms and about 15 angstroms. In some embodiments, the thickness T2 of the contact barrier layer 403 may be between about 11 angstroms and about 13 angstroms.

The contact barrier layer 403 may be formed of, for example, titanium, titanium nitride, titanium silicon nitride, tantalum, tantalum nitride, tantalum silicon nitride, or combination thereof. The contact barrier layer 403 may be employed to prevent conductive material of the contact 407 from diffusing into the interconnection structure 601.

With reference to FIGS. 1 and 2, a third insulating layer 611 may disposed on the interconnection structure 601. Specifically, the third insulating layer 611 may be disposed on the second insulating layer 609. The third insulating layer 611 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but is not limited thereto.

With reference to FIGS. 1 and 2, the capacitor structures 501 may be disposed in the third insulating layer 611 and respectively correspondingly disposed on the two contact structures 401. The capacitor structures 501 may be electrically connected to the two contact structures 401. The capacitor structures 501 may include capacitor bottom electrodes 503, a capacitor dielectric layer 505, and a capacitor top electrode 507.

With reference to FIGS. 1 and 2, the capacitor bottom electrodes 503 may be inwardly disposed in the third insulating layer 611. The bottoms of the capacitor bottom electrodes 503 may respectively correspondingly contact the top surfaces of the two contact structures 401. The capacitor bottom electrodes 503 may be formed of, for example, doped polysilicon, metal, metal nitride, or metal silicide. The capacitor dielectric layer 505 may be disposed on the capacitor bottom electrodes 503 and cover the top surface of the third insulating layer 611. The capacitor dielectric layer 505 may be formed of a single layer including an insulating material having a dielectric constant of about 4.0 or greater. The capacitor dielectric layer 505 may have a thickness between about 1 angstrom and about 100 angstroms. Alternatively, in some embodiments, the capacitor dielectric layer 505 may be formed of a stacked layer consisting of silicon oxide, silicon nitride, and silicon oxide. Alternatively, in some embodiments, the capacitor dielectric layer 505 may be formed of a stacked layer consisting of zirconium oxide, aluminum oxide, and zirconium oxide. The capacitor top electrode 507 may be disposed on the capacitor dielectric layer 505. The capacitor top electrode 507 may be formed of, for example, doped polysilicon, silicon germanium alloy, or metal.

Figure 3:
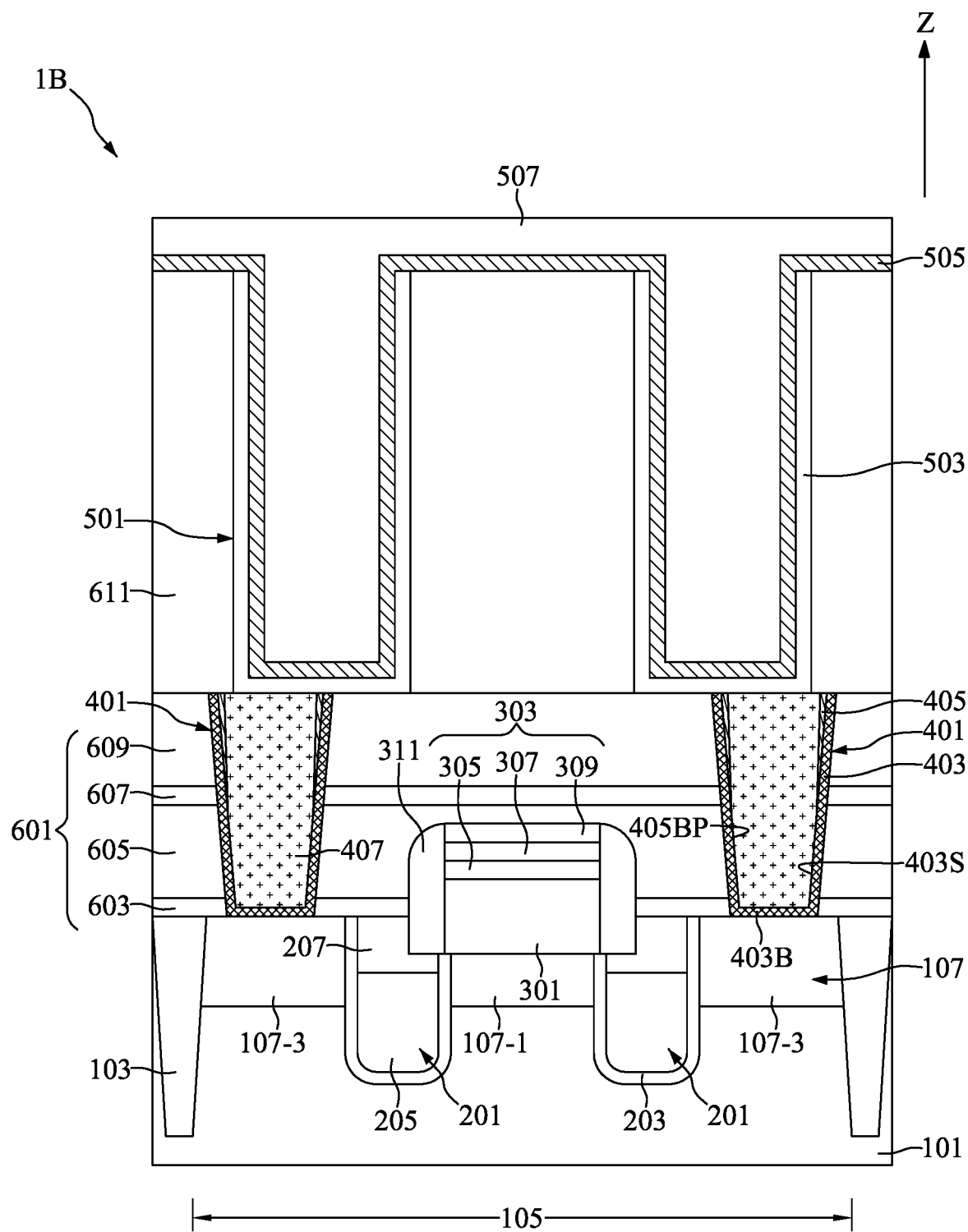
FIGS. 3 and 4 illustrate, in schematic cross-sectional view diagrams, semiconductor devices in accordance with some other embodiments of the present disclosure.
Figure 4:
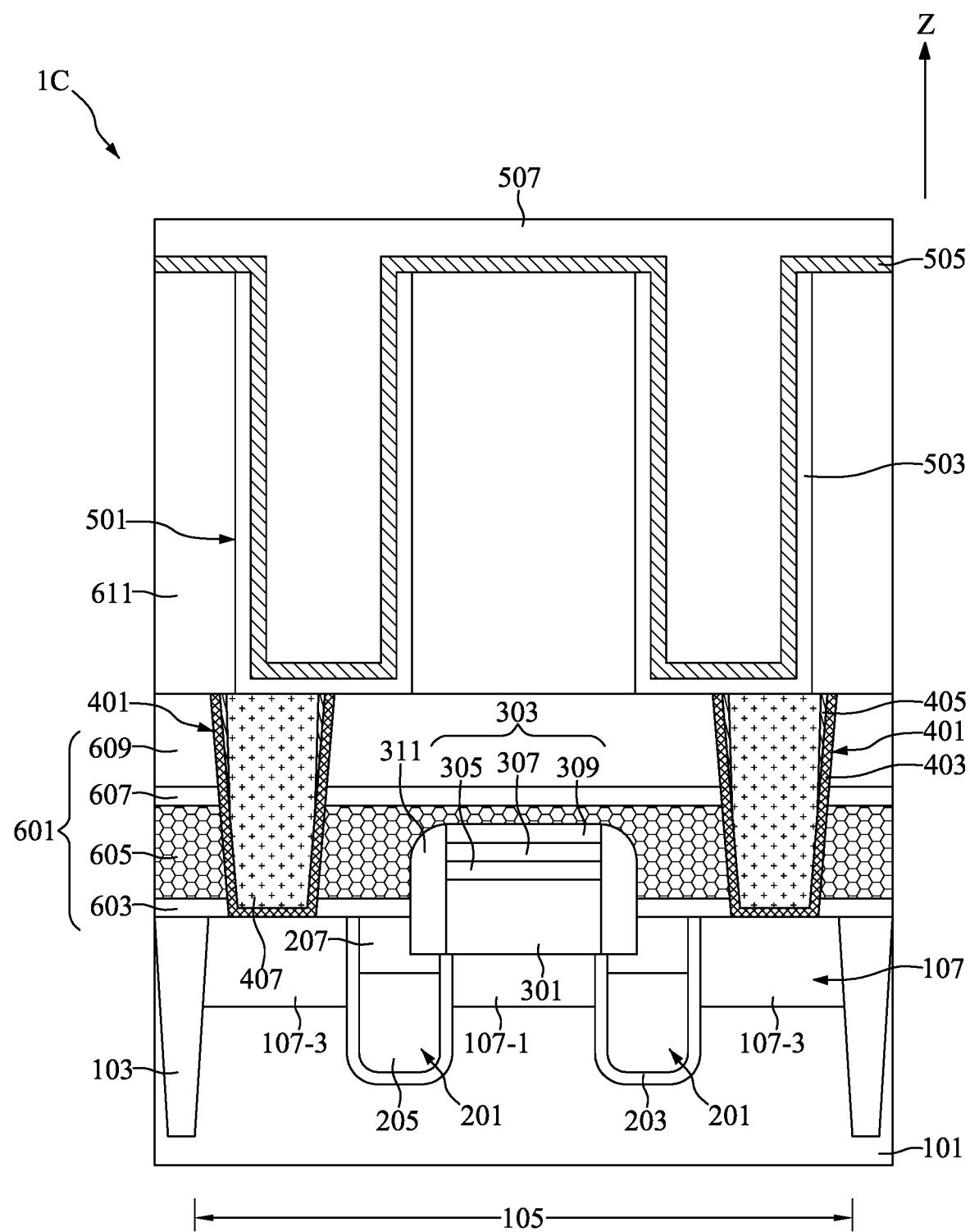

FIGS. 3 and 4 illustrate, in schematic cross-sectional view diagrams, semiconductor devices 1B and 1C in accordance with some other embodiments of the present disclosure.

With reference to FIG. 3, in the semiconductor device 1B, the bottom most points 405BP of the adjustment layers 405 may contact the bottom segment 403B of the contact barrier layer 403.

With reference to FIG. 4, in the semiconductor device 1C, the first insulating layer 605 may be porous. A porosity of the first insulating layer 605 may be between about 15% and about 50%. The first insulating layer 605 may have a dielectric constant less than 3.0. The first insulating layer 605 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The plurality of empty spaces of the first insulating layer 605 may be filled with air. As a result, a dielectric constant of the first insulating layer 605 may be significantly lower than a layer formed of, for example, silicon oxide. Therefore, the first insulating layer 605 may significantly reduce the parasitic capacitance between the two contact structures 401 and the bit line structure 303. That is, the first insulating layer 605 may significantly alleviate an interference effect between electrical signals induced or applied to the semiconductor device 1C.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 5:
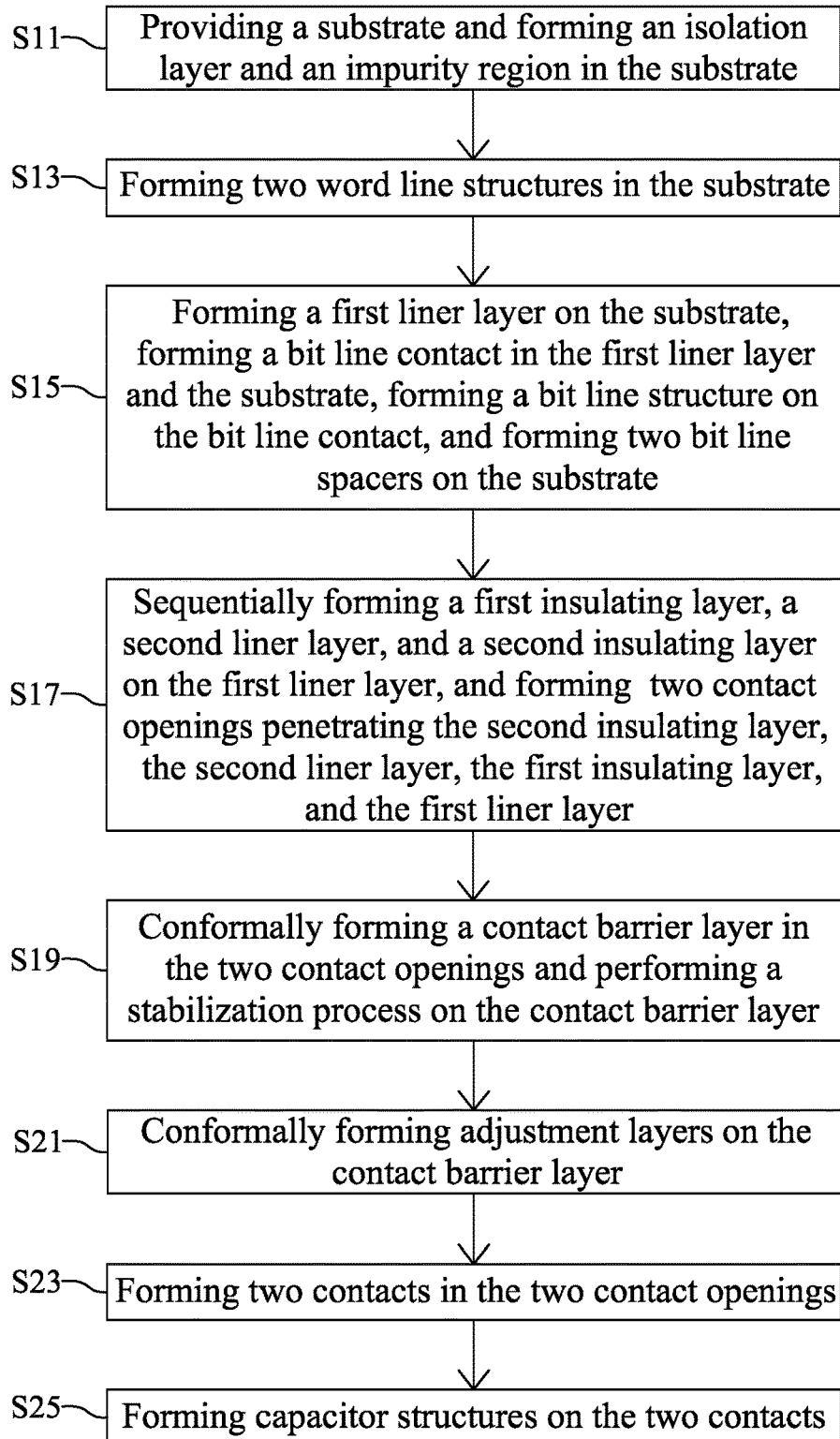
FIG. 5 illustrates, in a flowchart diagram form, a method for fabricating a semiconductor device in accordance with one embodiment of the present disclosure.

FIG. 5 illustrates, in a flowchart diagram form, a method 10 for fabricating a semiconductor device 1A in accordance with one embodiment of the present disclosure. FIGS. 6 to 28 illustrate, in schematic cross-sectional view diagrams, a flow for fabricating the semiconductor device 1A in accordance with one embodiment of the present disclosure.

Figure 6:
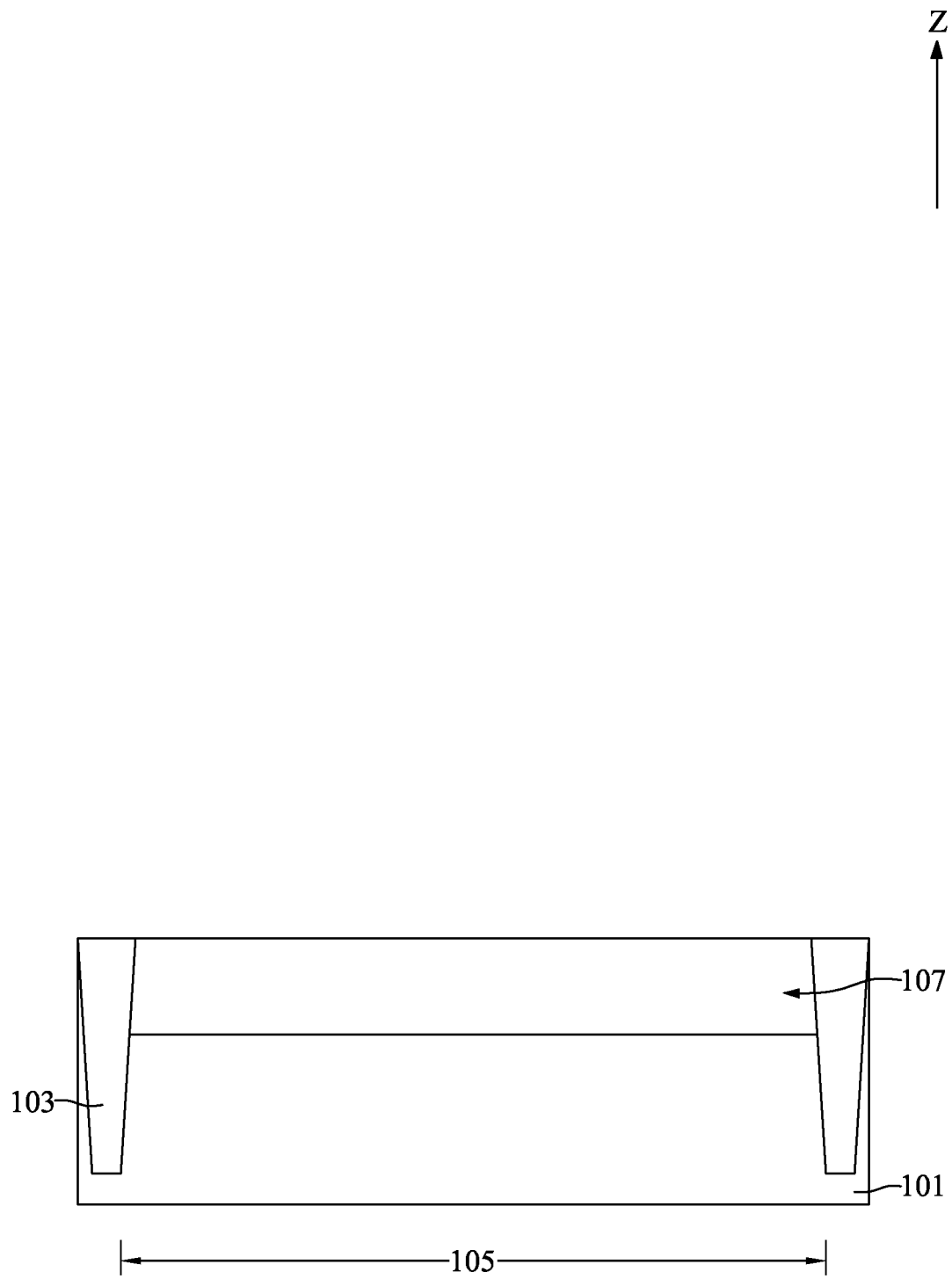
FIGS. 6 to 28 illustrate, in schematic cross-sectional view diagrams, a flow for fabricating the semiconductor device in accordance with one embodiment of the present disclosure.

With reference to FIGS. 5 and 6, at step S11, a substrate 101 may be provided and an isolation layer 103 and an impurity region 107 may be formed in the substrate 101.

With reference to FIG. 6, the isolation layer 103 may be formed in the substrate 101 and define an active area 105. An implantation process may be performed to dope a dopant into the upper portion of the active area 105 and concurrently form the impurity region 107 in the active area 105. The dopant may be phosphorus, arsenic, or antimony.

It should be noted that the active area 105 may comprise a portion of the substrate 101 and a space above the portion of the substrate 101. Describing an element as being disposed on the active area 105 means that the element is disposed on a top surface of the portion of the substrate 101. Describing an element as being disposed in the active area 105 means that the element is disposed in the portion of the substrate 101; however, a top surface of the element may be even with the top surface of the portion of the substrate 101. Describing an element as being disposed above the active area 105 means that the element is disposed above the top surface of the portion of the substrate 101.

With reference to FIG. 5 and FIGS. 7 to 10, at step S13, two word line structures 201 may be formed in the substrate 101.

Figure 7:
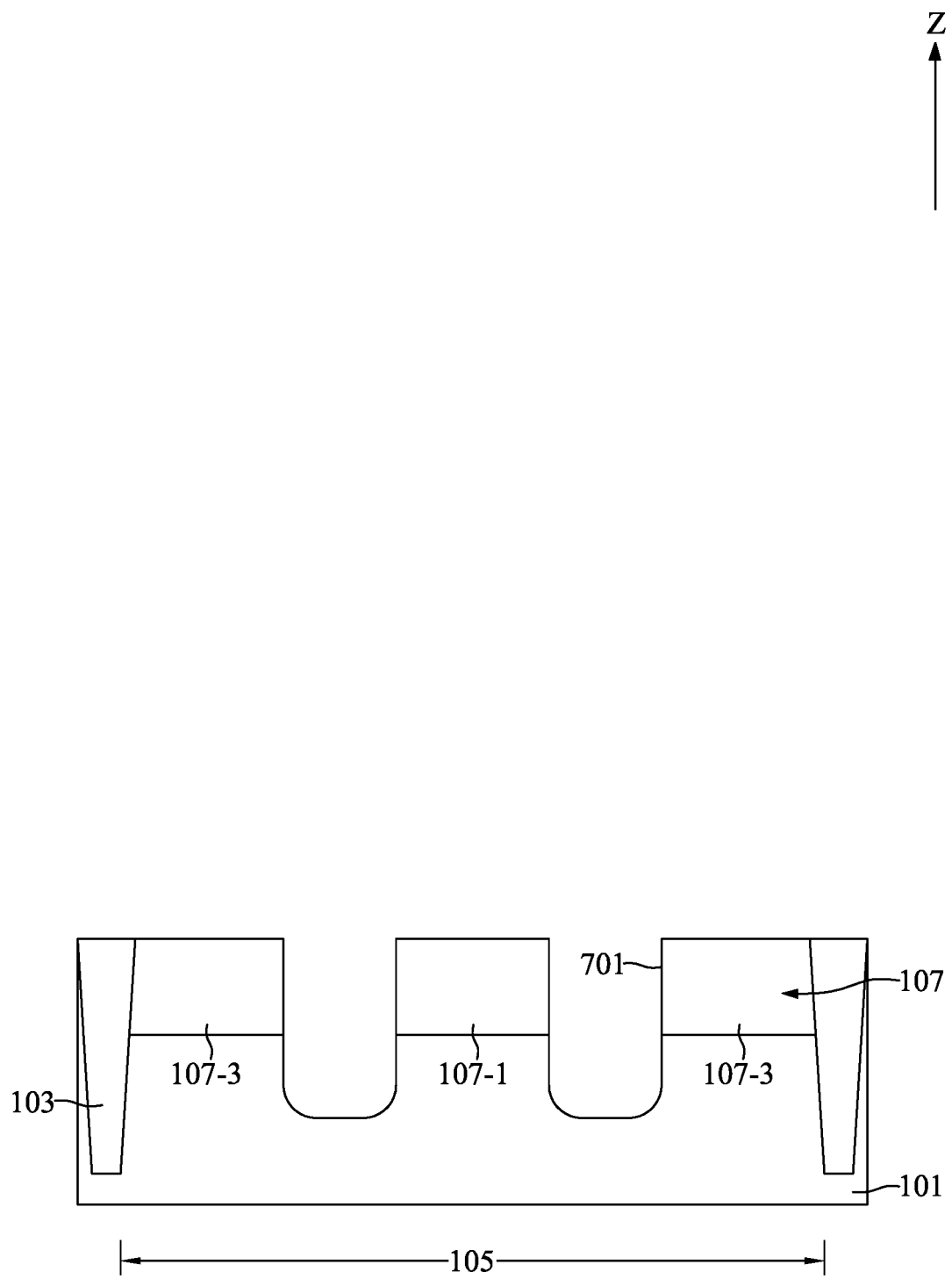

With reference to FIG. 7, two word line trenches 701 may be formed penetrating the impurity region 107 and portions of the substrate 101. The two word line trenches 701 may divide the impurity region 107 into a first impurity region 107-1 and two second impurity region 107-3. The first impurity region 107-1 may be formed between the two word line trenches 701. The two second impurity region 107-3 may be formed between the two word line trenches 701 and the isolation layer 103. In some embodiments, the bottom surfaces of the two word line trenches 701 may be flat. For convenience of description, only one word line trench 701 is described.

Figure 8:
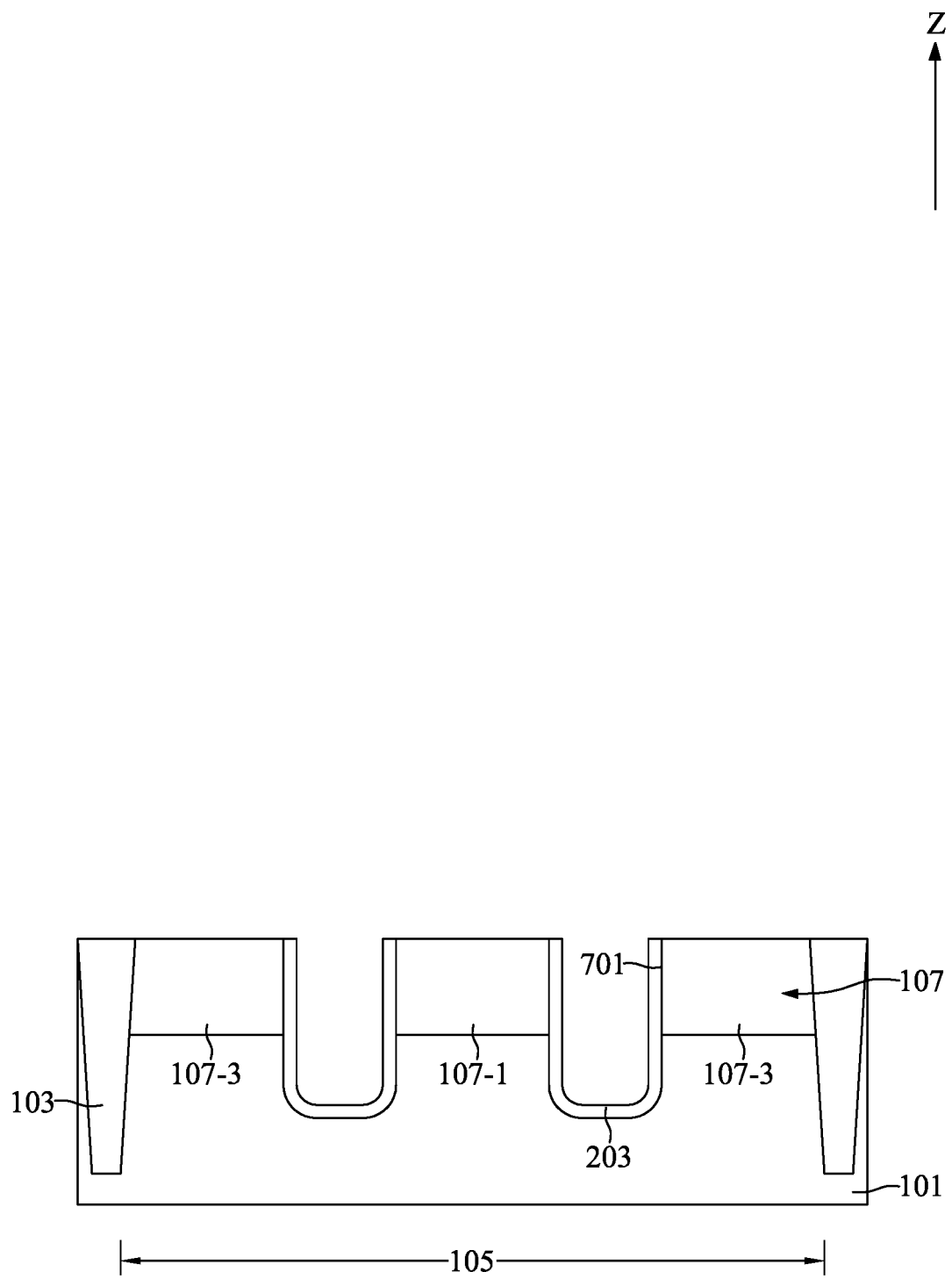

With reference to FIG. 8, a word line dielectric layer 203 may be formed in the word line trench 701. The top surface of the word line dielectric layer 203 may be substantially coplanar with the top surface of the substrate 101. The word line dielectric layer 203 may have a U-shaped cross-sectional profile. Corner effects may be avoided if the word line dielectric layer 203 has a U-shape cross-sectional profile.

Figure 9:
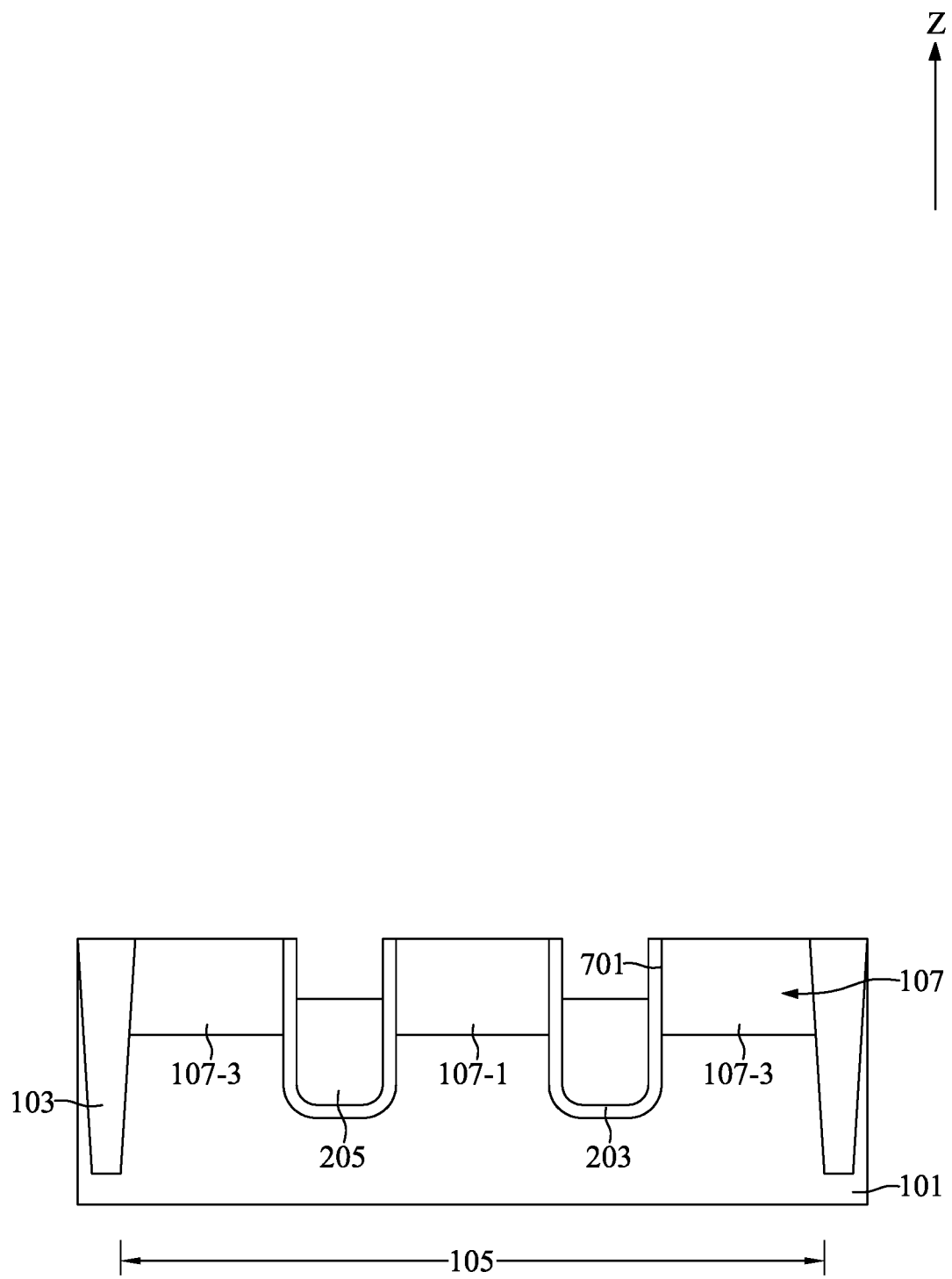

With reference to FIG. 9, a word line electrode 205 may be formed on the word line dielectric layer 203 in the word line trench 701. Specifically, a layer of conductive material may be deposited to completely fill the word line trench 701. An etch back process may be performed to recess the top surface of the layer of conductive material to a vertical level lower than the vertical level of the top surface of the substrate 101. The word line electrode 205 may be concurrently formed after the etch back process. The conductive material may include doped polysilicon, silicon germanium, metal, metal alloy, metal silicide, metal nitride, or metal carbide.

Figure 10:
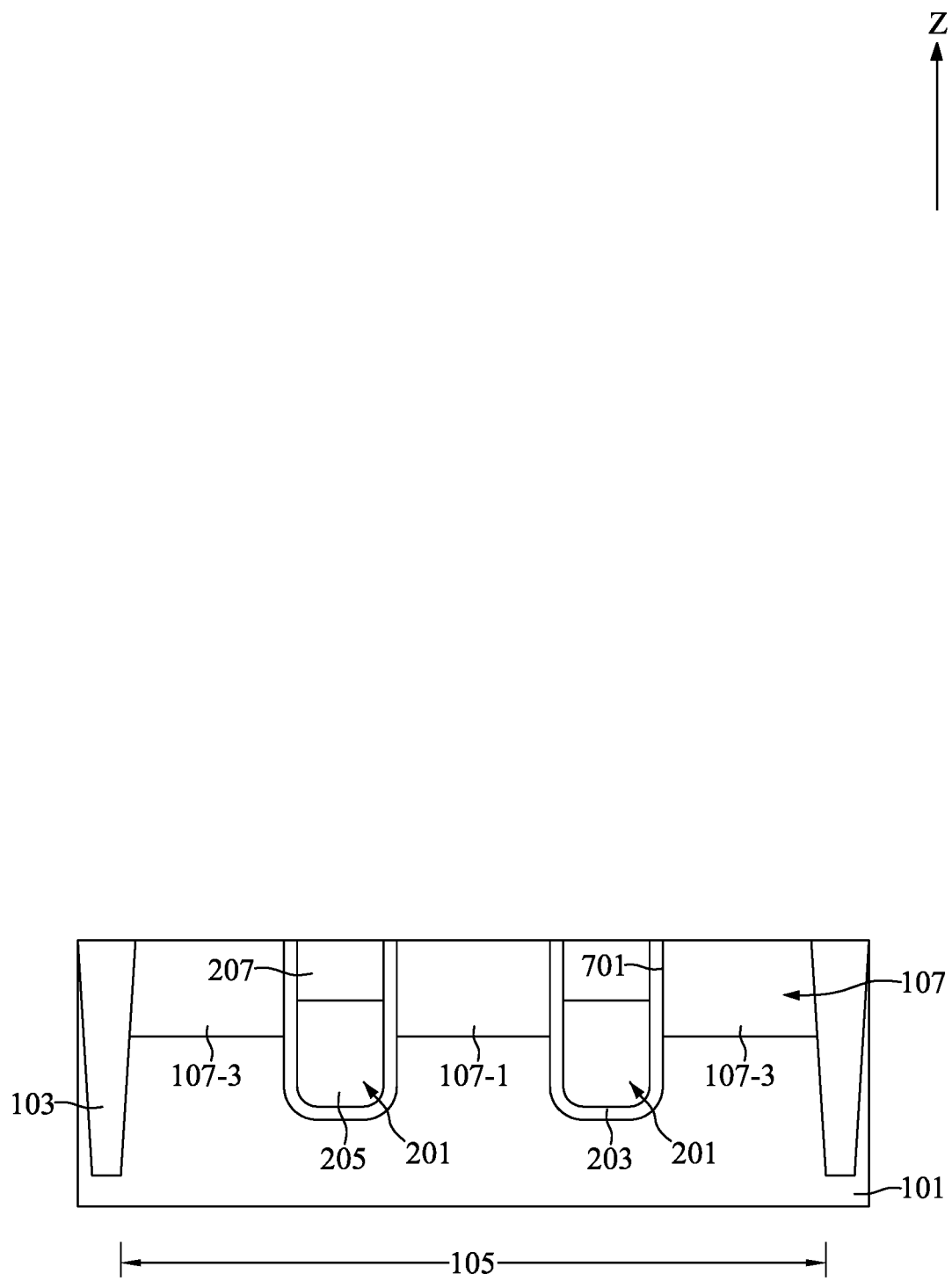

With reference to FIG. 10, a word line capping layer 207 may be formed on the word line electrode 205 in the word line trench 701. Specifically, a layer of insulating material may be deposited to completely fill the word line trench 701. A planarization process, such as chemical mechanical polishing, may be performed to remove excess material, provide a substantially flat surface for subsequent processing steps, and conformally form the word line capping layer 207. The layer of insulating material may include silicon oxide, silicon nitride, silicon oxynitride, silicon nitride oxide, fluoride-doped silicate, or the like.

With reference to FIGS. 5 and FIGS. 11 to 16, at step S15, a first liner layer 603 may be formed on the substrate 101, a bit line contact 301 may be formed in the first liner layer 603 and the substrate 101, a bit line structure 303 may be formed on the bit line contact 301, and two bit line spacers 311 may be formed on the substrate 101.

Figure 11:
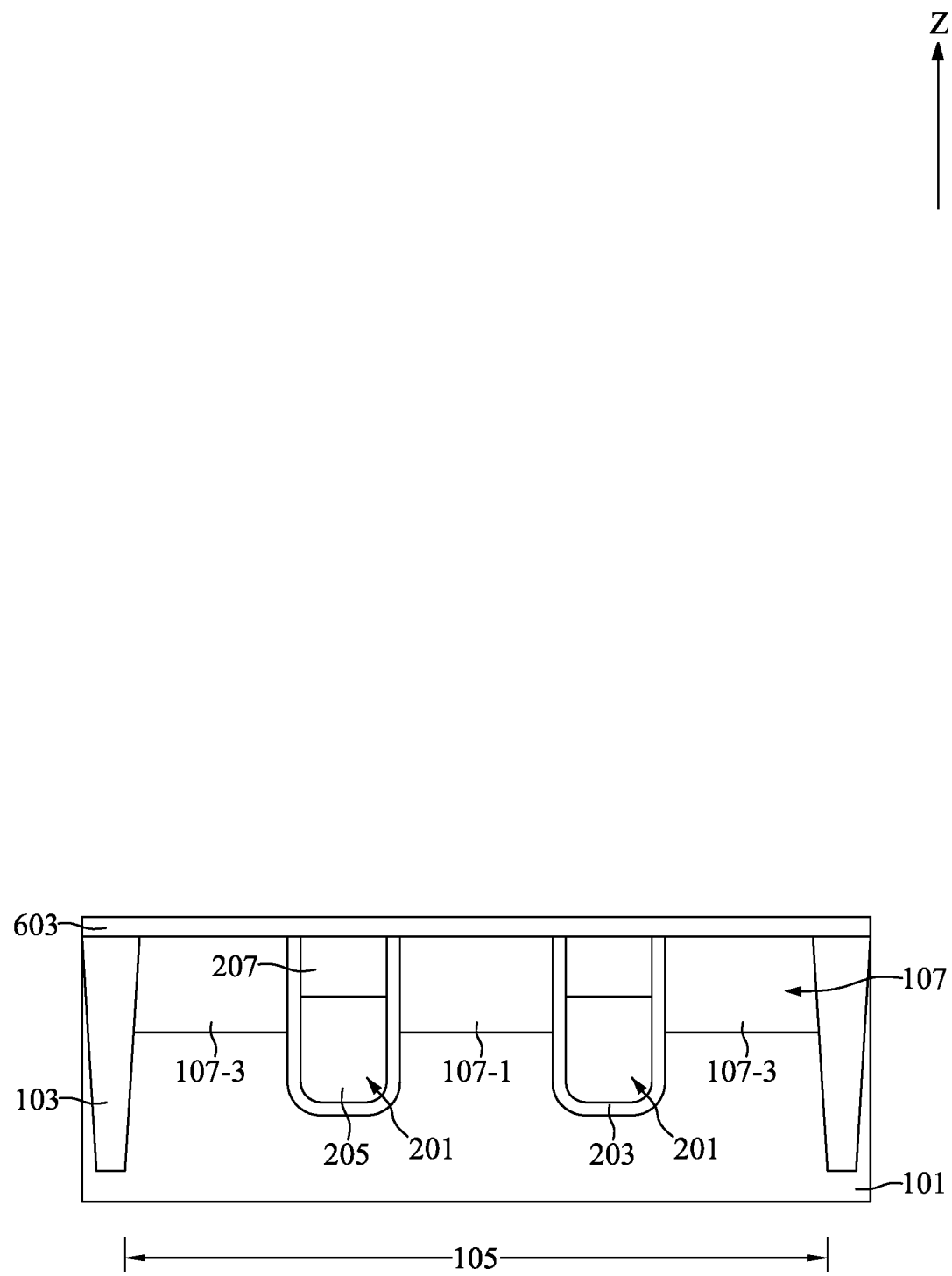
Figure 12:
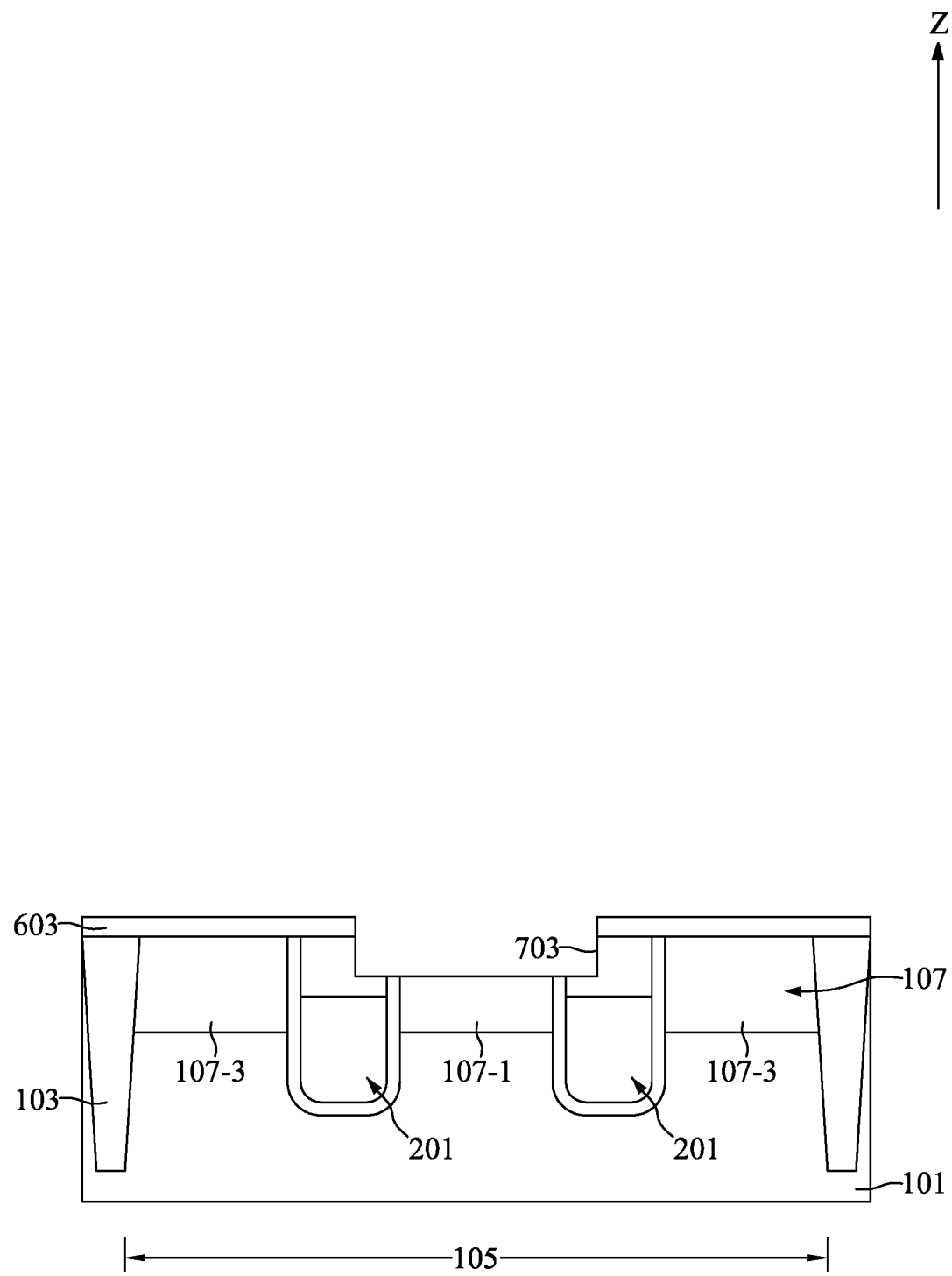

With reference to FIG. 11, the first liner layer 603 may be formed on the substrate 101 by a deposition process. With reference to FIG. 12, a photolithography process may be performed to define a position of the bit line contact 301 on the first liner layer 603. After the photolithography process, an etch process, such as an anisotropic dry etch process, may be performed to form a bit line contact opening 703 passed through the first liner layer 603 and an upper portion of the substrate 101.

Figure 13:
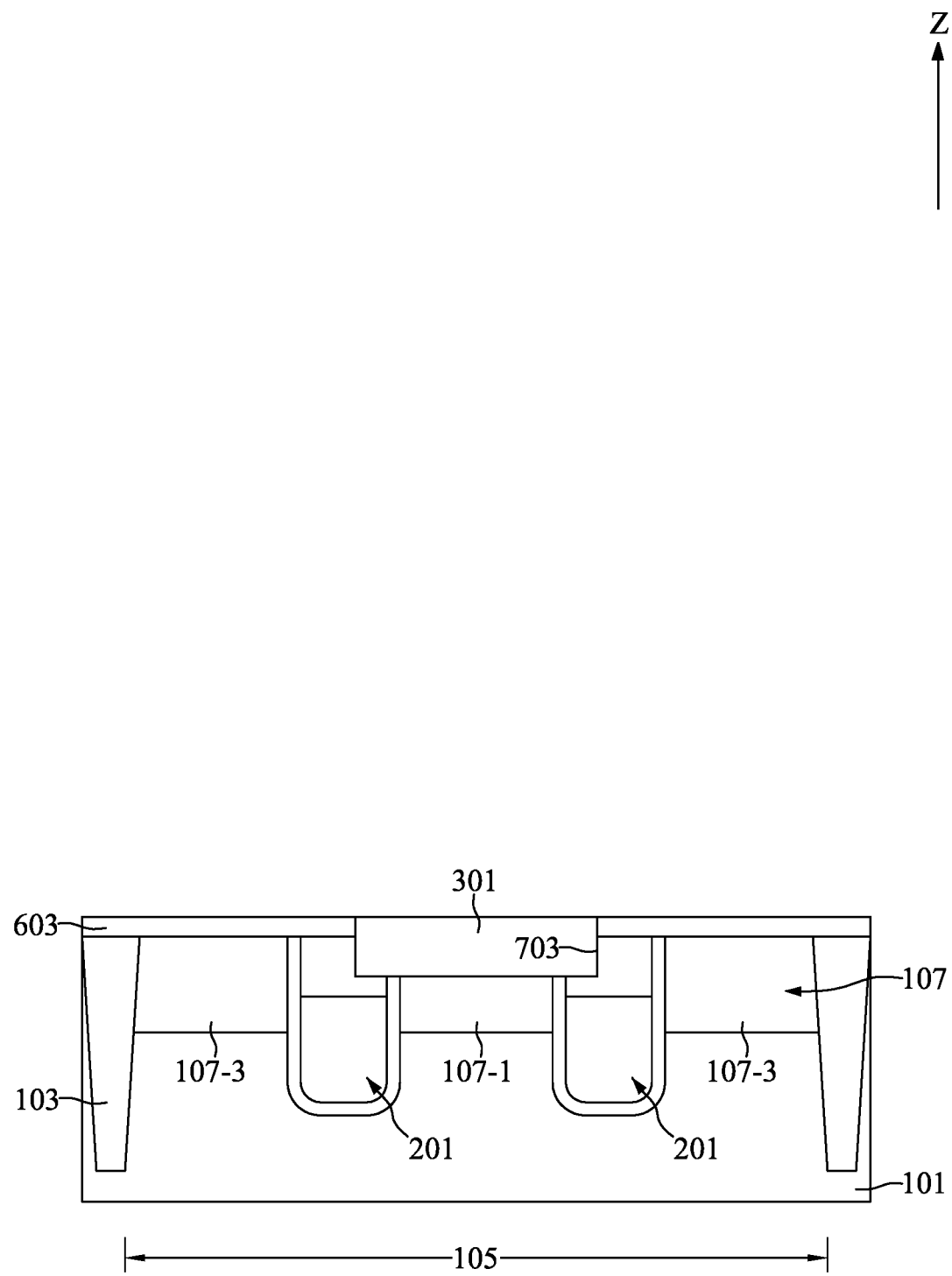

With reference to FIG. 13, a conductive material such as doped polysilicon, a metal, or a metal silicide may be deposited into the first bit line contact opening 213 by a deposition process. After the deposition process, a planarization process, such as chemical mechanical polishing, may be performed to remove excess material, provide a substantially flat surface for subsequent processing steps, and conformally form the bit line contact 301. It should be noted that, the bit line contact 301 may completely fill the bit line contact opening 703.

Figure 14:
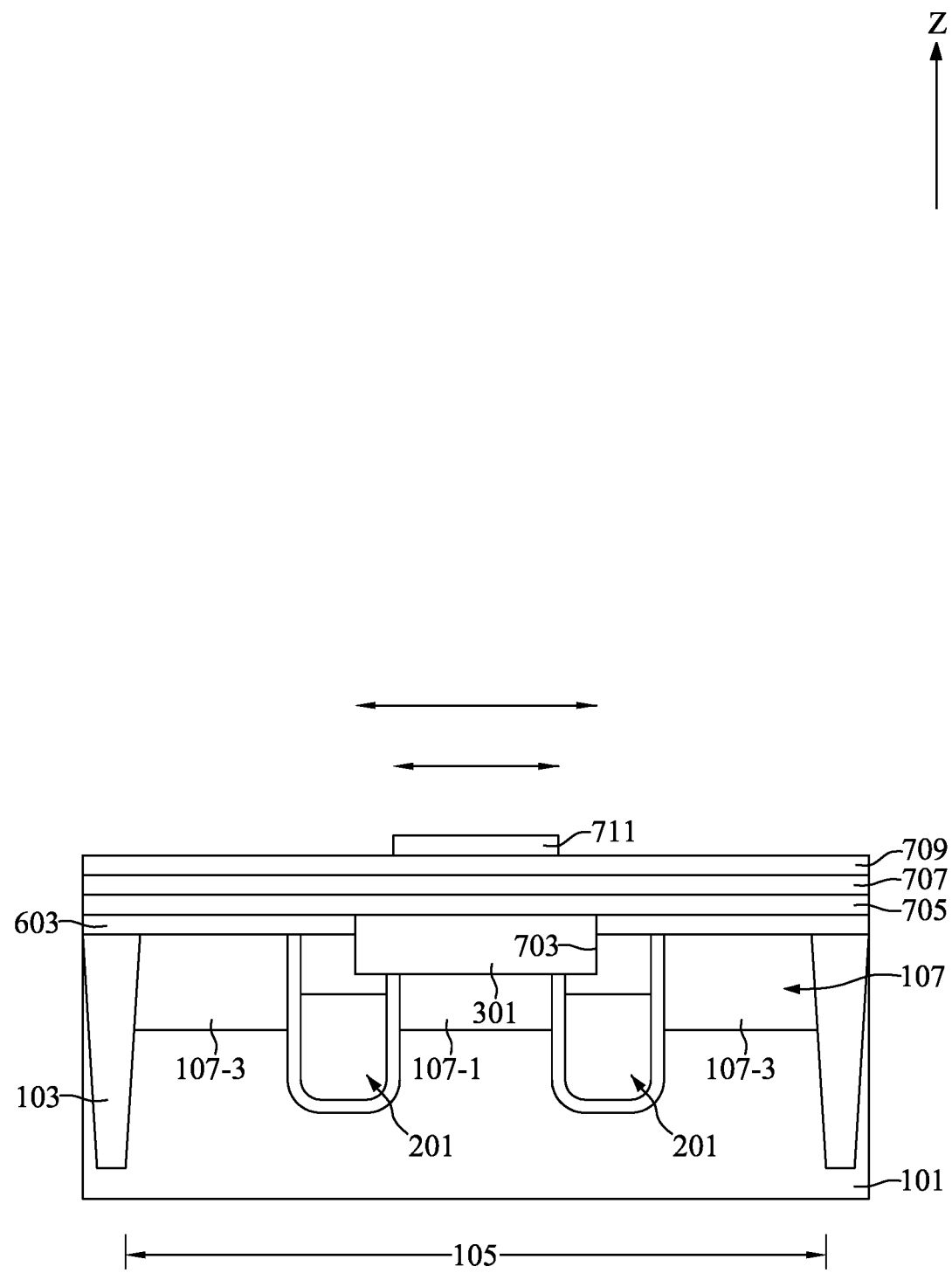

With reference to FIG. 14, a series of deposition processes may be performed to deposit a layer of bottom conductive material 705, a layer of top conductive material 707, a layer of capping layer material 709, and a bit line mask layer 711 on the first liner layer 603. The bottom conductive material 705 may include, for example, doped polysilicon. The top conductive material 707 may include, for example, copper, nickel, cobalt, aluminum, or tungsten. The capping layer material 709 may be formed of, for example, silicon oxide or silicon nitride. The bit line mask layer 711 may be a photoresist layer. A photolithography process may be performed to define a position of the bit line structure 303 by pattering the bit line mask layer 711.

Figure 15:
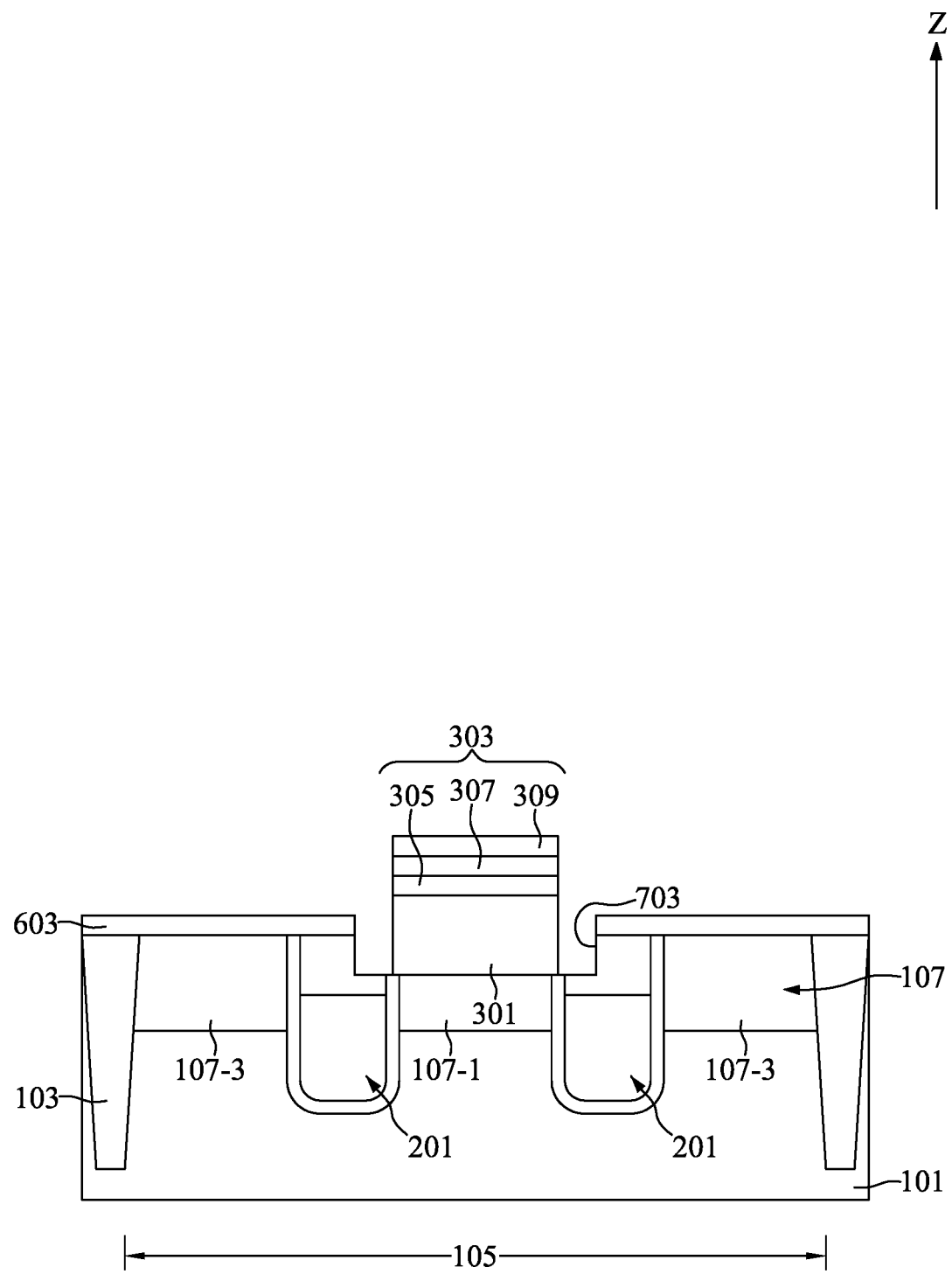

With reference to FIG. 15, a series etch processes may be performed with the bit line mask layer 711 as a mask. During the etch processes, most of the layer of capping layer material 709, most of the layer of top conductive material 707, and most of the layer of bottom conductive material 705 may be removed, only portions of the layer of capping layer material 709, the layer of top conductive material 707, and the layer of bottom conductive material 705 underneath the bit line mask layer 711 may be retained. The retained portions of the layer of capping layer material 709 may be turned into the bit line capping layer 309. The retained portions of the layer of top conductive material 707 may be turned into the bit line top conductive layer 307. The retained portions of the layer of bottom conductive material 705 may be turned into the bit line bottom conductive layer 305. The bit line capping layer 309, the bit line top conductive layer 307, and the bit line bottom conductive layer 305 together form the bit line structure 303. In addition, portions of the bit line contact 301 exposed during the etch processes may be removed, in other words, a width of the bit line contact 301 may be reduced. Hence, the bit line contact 301 may be respectively correspondingly distanced from sidewalls of the bit line contact opening 703. The bit line mask layer 711 may be removed after the etch processes.

Figure 16:
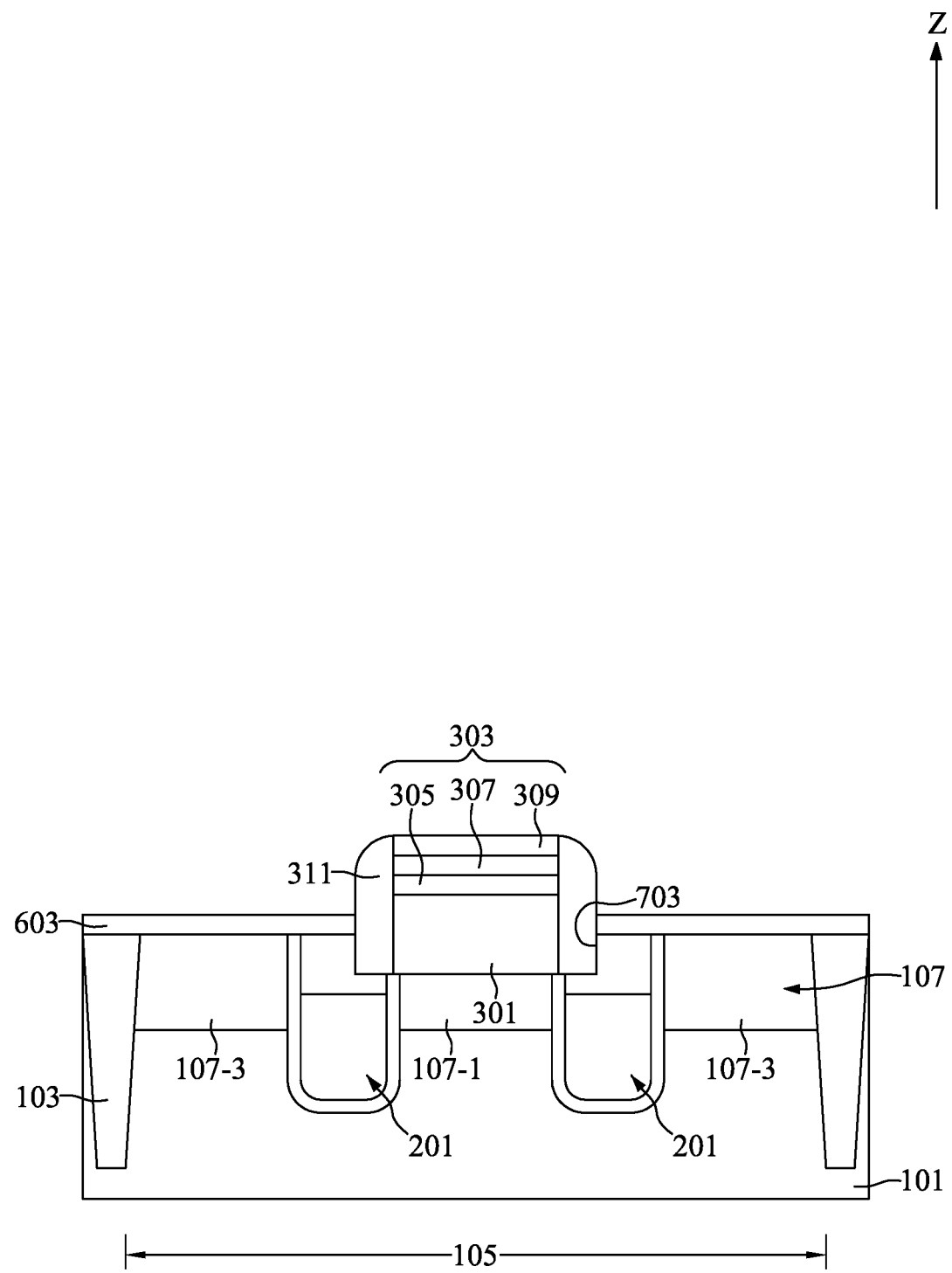

With reference to FIG. 16, a spacer layer may be deposit over the first liner layer 603 by a deposition process to cover the first liner layer 603, the bit line structure 303, and completely fill the bit line contact opening 703. After the deposition process, an etch process, such as an anisotropic dry etch process, may be performed until top surfaces of the bit line capping layer 309 is exposed and concurrently form the two bit line spacers 311.

Figure 17:
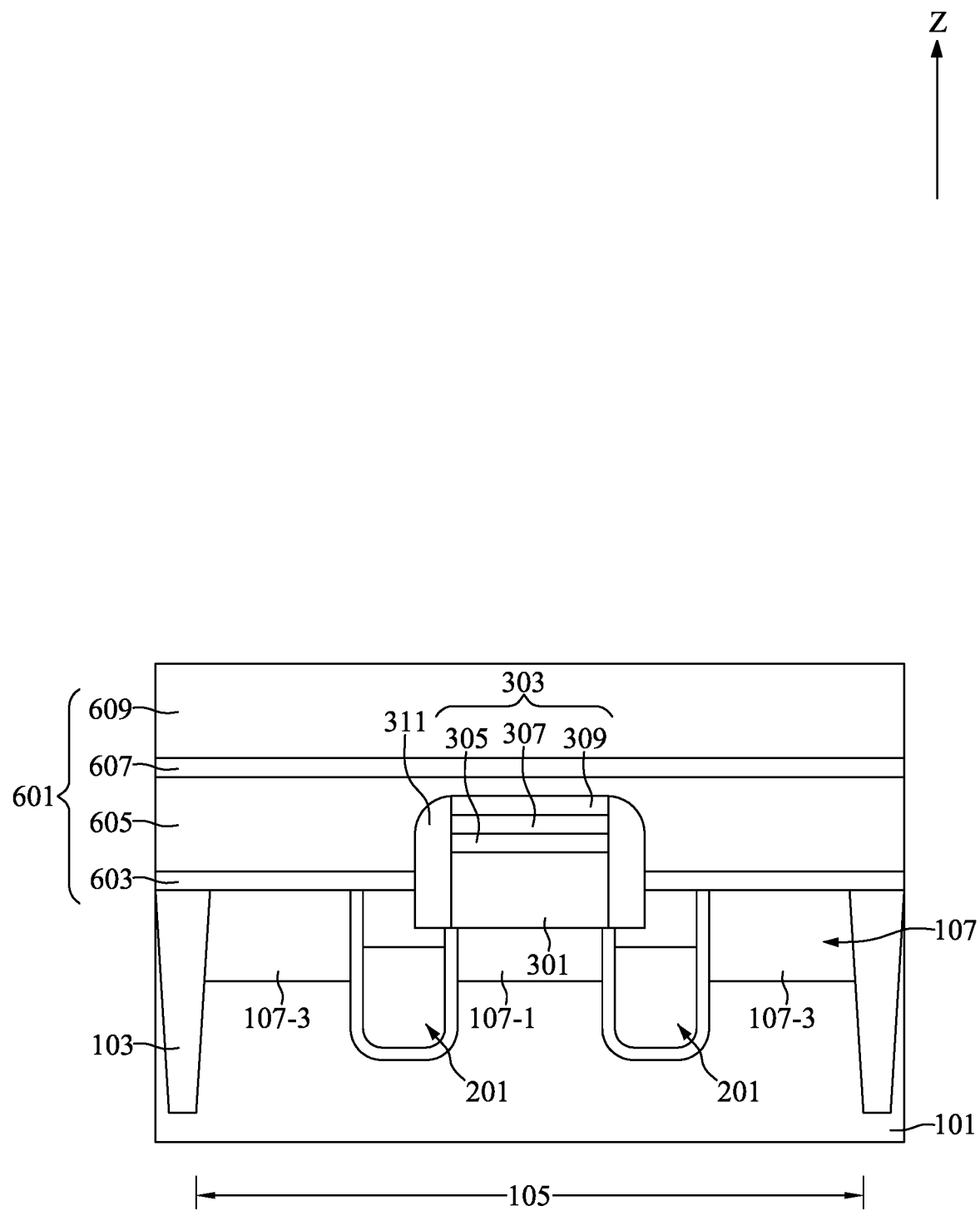
Figure 18:
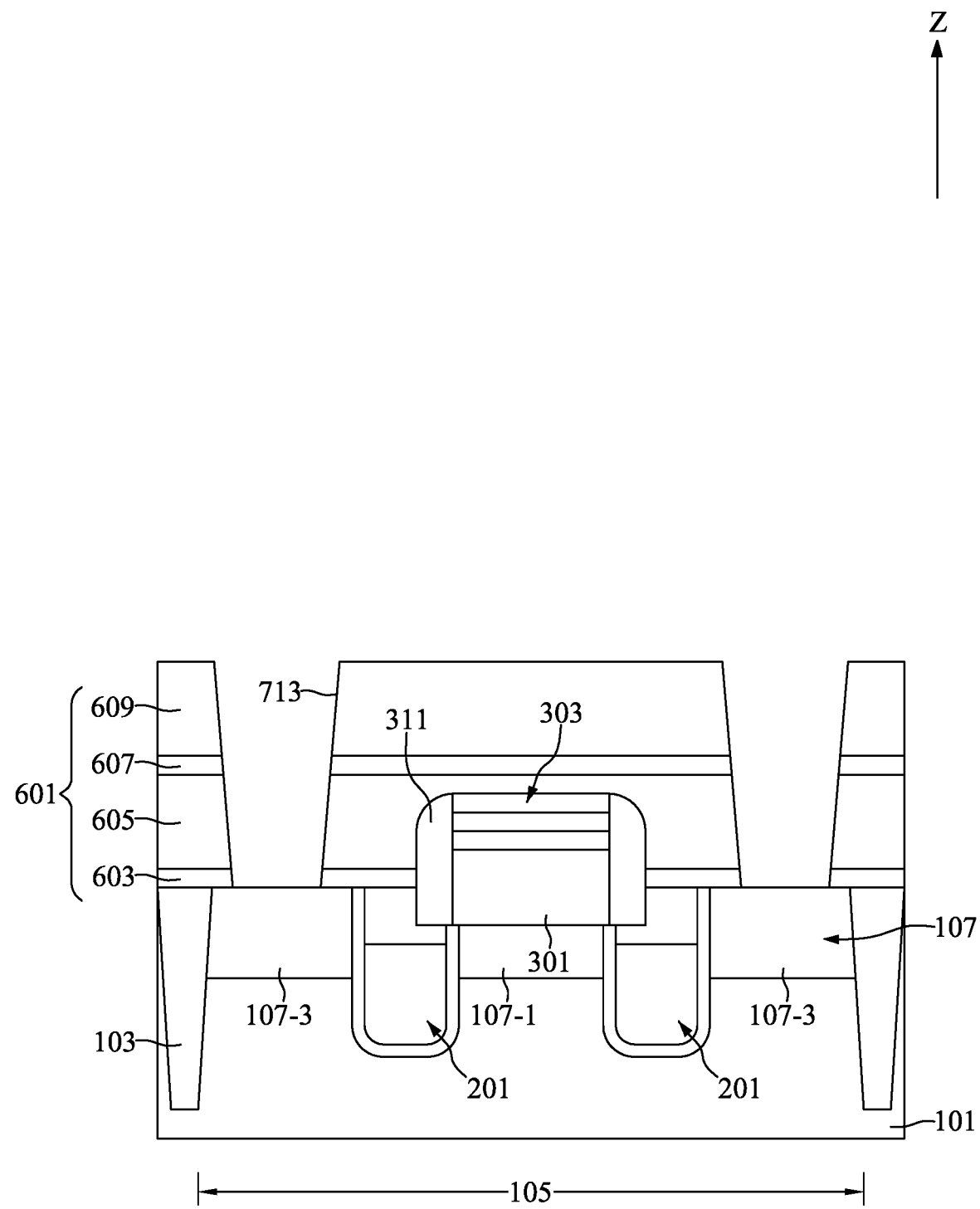

With reference to FIGS. 5, 17, and 18, at step S17, a first insulating layer 605, a second liner layer 607, and a second insulating layer 609 may be sequentially formed on the first liner layer 603, and two contact openings 713 may be formed so as to penetrate the second insulating layer 609, the second liner layer 607, the first insulating layer 605, and the first liner layer 603.

With reference to FIG. 17, the first insulating layer 605 may be formed on the first liner layer 603 and may cover the bit line structure 303 and the two bit line spacers 311. The second liner layer 607 may be formed on the first insulating layer 605. The second insulating layer 609 may be formed on the second liner layer 607. The first liner layer 603, the first insulating layer 605, the second liner layer 607, and the second insulating layer 609 together form the interconnection structure 601.

With reference to FIG. 18, a photolithography process may be performed to define positions of the two contact openings 713. After the photolithography process, an etch process, such as an anisotropic dry etch process, may be performed to remove portions of the interconnection structure 601 and concurrently form the two contact openings 713. The two second impurity region 107-3 may be exposed through the two contact openings 713.

With reference to FIG. 5 and FIGS. 19 to 22, at step S19, a contact barrier layer 403 may be conformally formed in the two contact openings 713 and a stabilization process 715 may be performed on the contact barrier layer 403.

Figure 19:
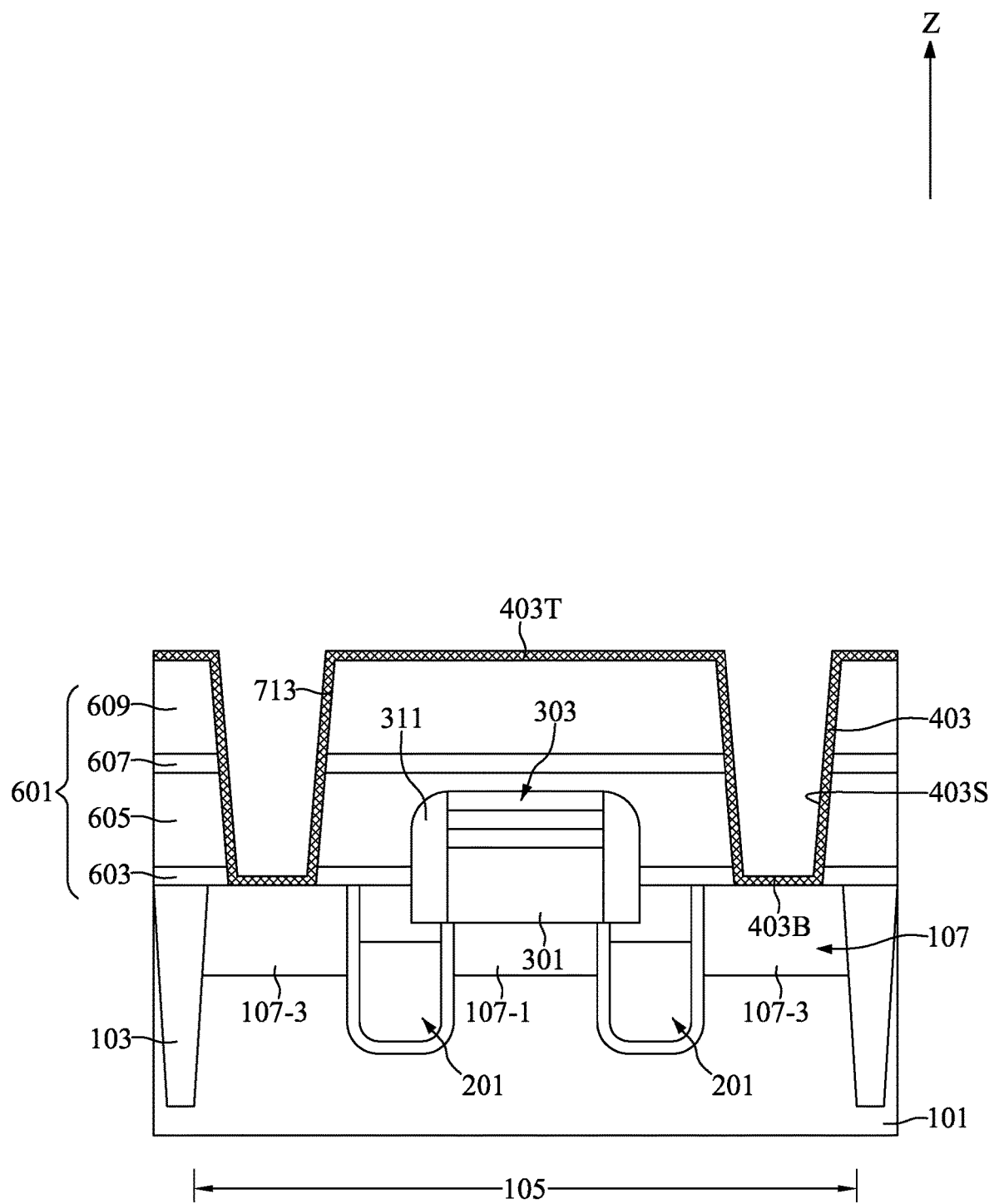

With reference to FIG. 19, the contact barrier layer 403 may be conformally formed on the top surface of the second insulating layer 609 and in the two contact openings 713. The contact barrier layer 403 may include top segments 403T, side segments 403S, and bottom segments 403B. The top segments 403T may be formed on the top surface of the second insulating layer 609. The side segments 403S may be formed on the sidewalls of the two contact openings 713. The bottom segments 403B may be formed on the bottom surfaces of the two contact openings 713.

Figure 20:
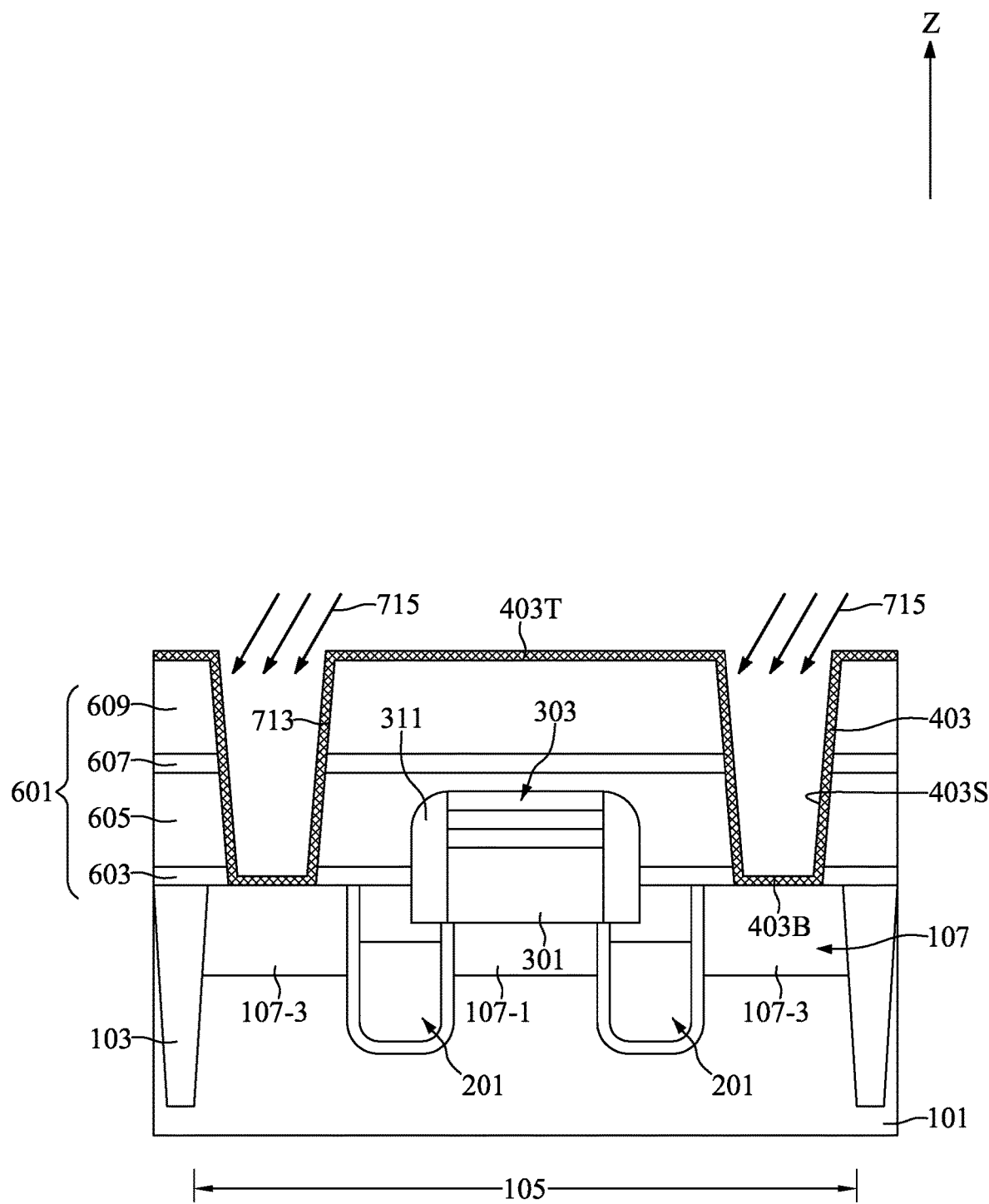
Figure 21:
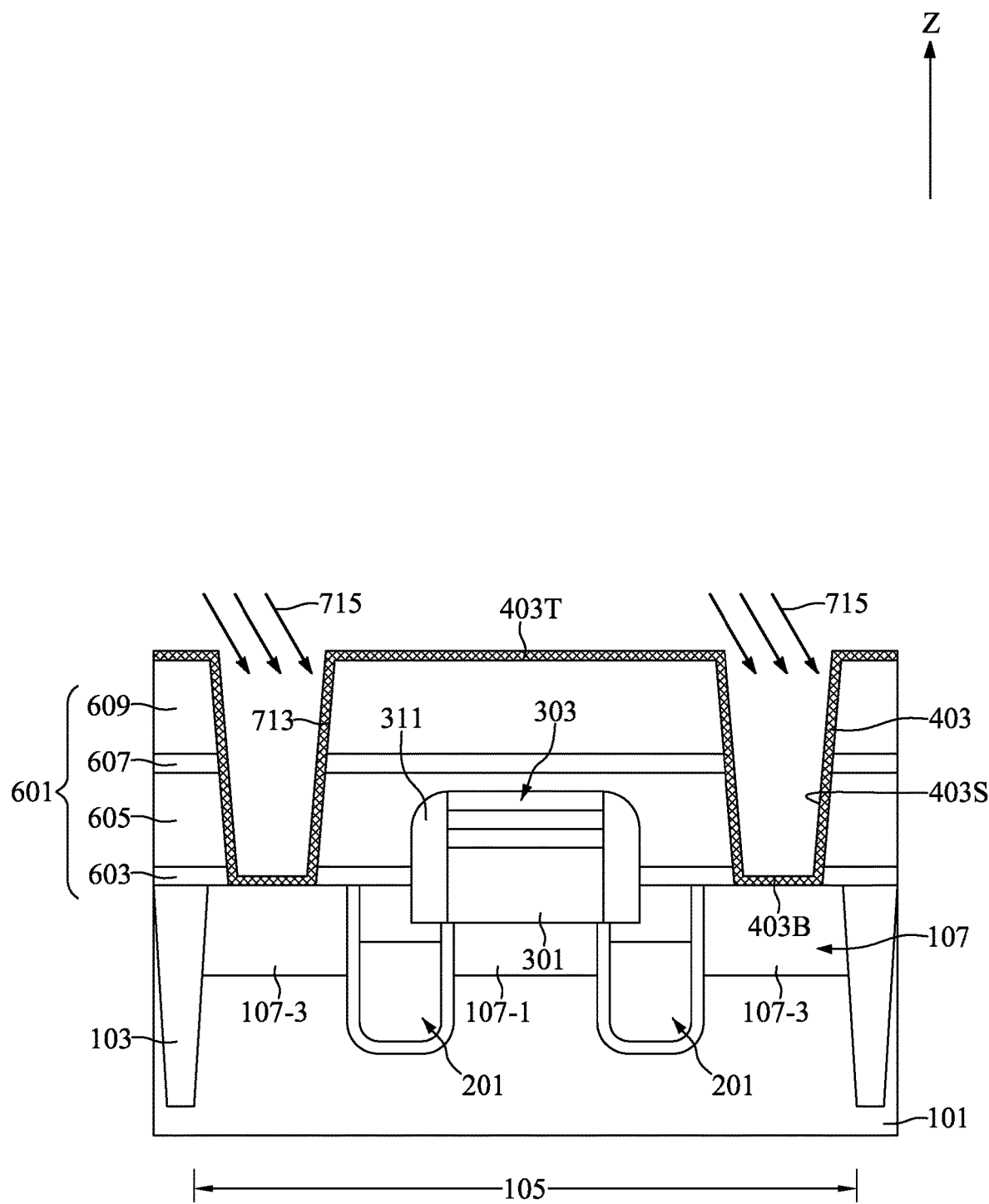

With reference to FIGS. 20 and 21, the stabilization process 715 may include a tilted aluminum implantation process and an oxidation process. The tilted aluminum implantation process may insert aluminum into the top segments 403T and upper portions of the side segments 403S. The oxidation process may oxidize the aluminum inserted into the contact barrier layer 403 and may stabilize the contact barrier layer 403.

Figure 22:
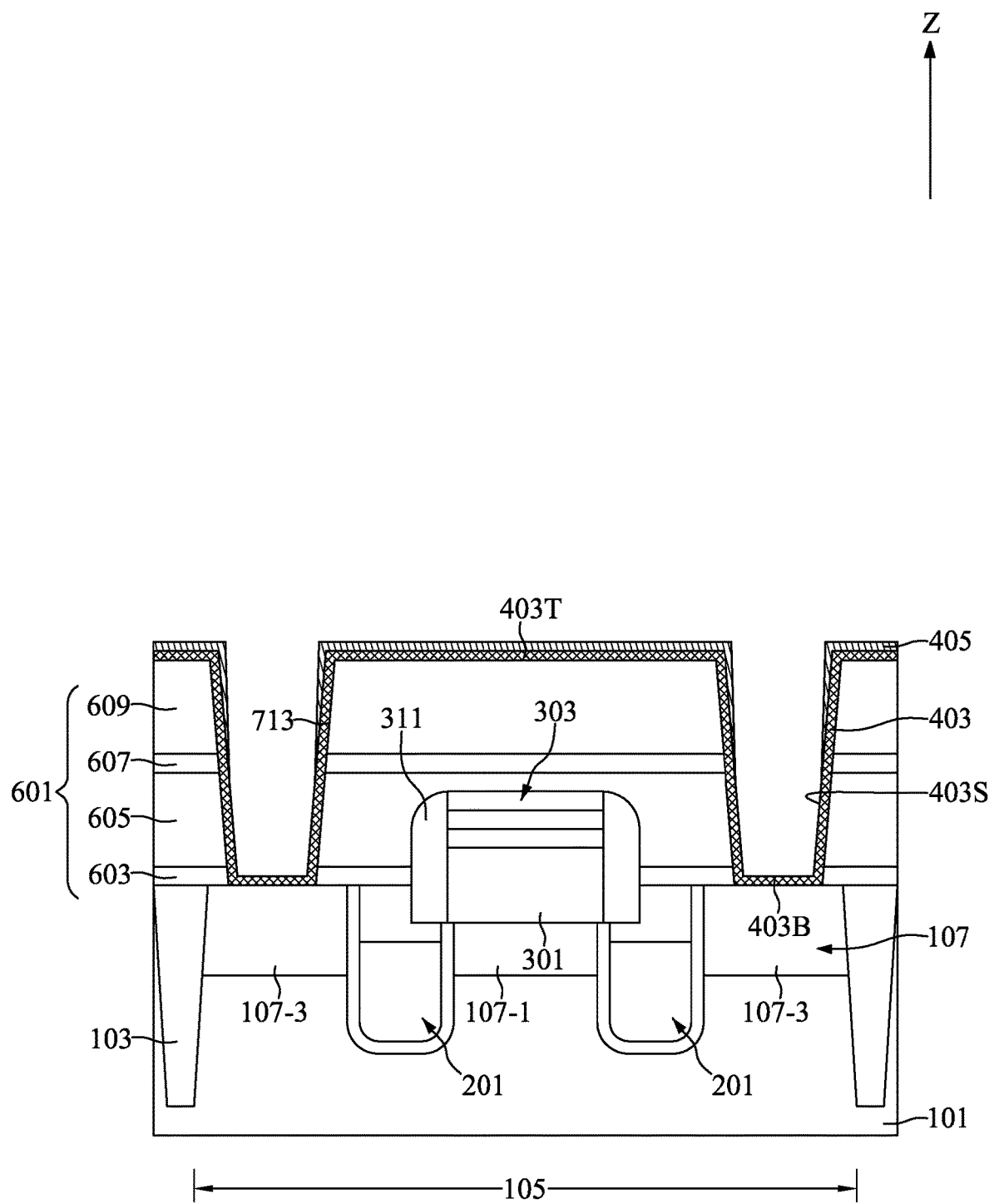

With reference to FIGS. 5 and 22, at step S21, adjustment layers 405 may be conformally formed on the contact barrier layer 403 in the two contact openings 713.

With reference to FIG. 22, in some embodiments, the adjustment layers 405 may be formed by a deposition process such as an atomic layer deposition method precisely controlling an amount of a first precursor of the atomic layer deposition method. The adjustment layers 405 may be formed of, for example, aluminum oxide, hafnium oxide, zirconium oxide, titanium oxide, titanium nitride, tungsten nitride, silicon nitride, or silicon oxide.

In some embodiments, when the adjustment layers 405 are formed of aluminum oxide, the first precursor of the atomic layer deposition method may be trimethylaluminum and a second precursor of the atomic layer deposition method may be water or ozone.

In some embodiments, when the adjustment layers 405 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the adjustment layers 405 are formed of zirconium oxide, the first precursor of the atomic layer deposition method may be zirconium tetrachloride and the second precursor of the atomic layer deposition method may be water or ozone.

In some embodiments, when the adjustment layers 405 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the adjustment layers 405 are formed of titanium nitride, the first precursor of the atomic layer deposition method may be titanium tetrachloride and ammonia.

In some embodiments, when the adjustment layers 405 are formed of tungsten nitride, the first precursor of the atomic layer deposition method may be tungsten hexafluoride and ammonia.

In some embodiments, when the adjustment layers 405 are formed of silicon nitride, the first precursor of the atomic layer deposition method may be silylene, chlorine, ammonia, and/or dinitrogen tetrahydride.

In some embodiments, when the adjustment layers 405 are formed of silicon oxide, the first precursor of the atomic layer deposition method may be silicon tetraisocyanate or $CH_3OSi(NCO)_3$ and the second precursor of the atomic layer deposition method may be hydrogen or ozone.

In some embodiments, the adjustment layers 405 may be formed by conformally deposited a metal in the two contact openings 713. Due to the geometry of the two contact openings 713 may prevent the metal from reaching the bottom surfaces of the two contact openings 713. Thus, the metal may deposit faster on the side segments 403S than on the bottom segment 403B. Subsequently, a plasma treatment using a nitrogen-containing or carbon-containing gas may be applied to turn the metal into a metal nitride or a metal carbide.

In some embodiments, the adjustment layer 405 may be conformally formed on the side segments 403S and the bottom segments 403B. An anisotropic etching process may be applied to remove the adjustment layers 405 formed on the bottom segments 403B.

Figure 23:
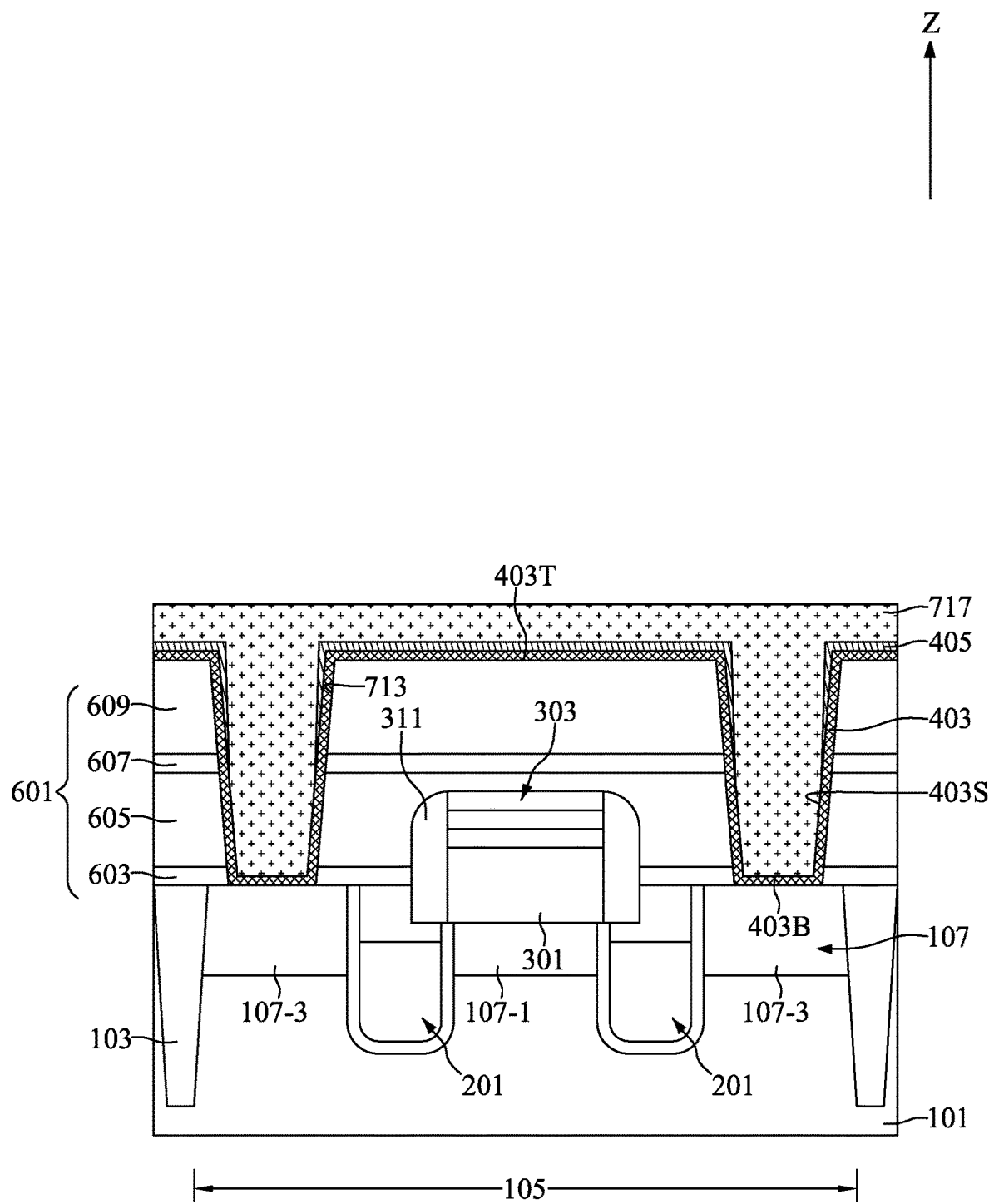
Figure 24:
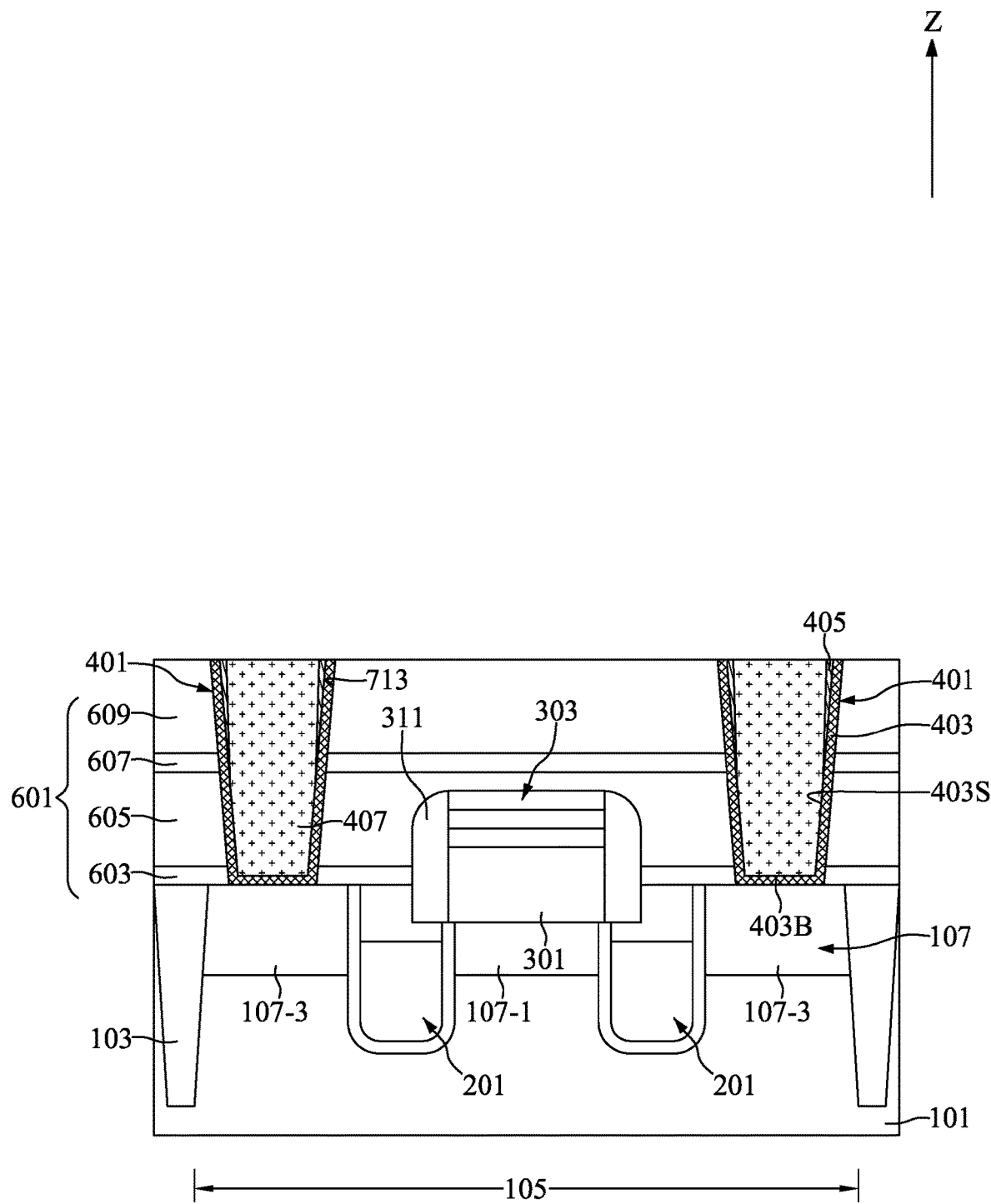

With reference to FIGS. 5, 23, and 24, at step S23, two contacts 407 may be respectively correspondingly formed in the two contact openings 713.

With reference to FIG. 23, a layer of contact material 717 may be deposited over the intermediate semiconductor device illustrated in FIG. 22 and completely fill the two contact openings 713. The layer of contact material 717 may be deposited by atomic layer deposition, chemical vapor deposition, or other conformal deposition method. Due to the presence of the adjustment layers 405, the deposition rate of the contact material 717 on the sidewalls of the two contact openings 713 may be reduced. Hence, the deposition rate of the contact material 717 on the sidewalls of the two contact openings 713 and the deposition rate of the contact material 717 on the bottom surfaces of the two contact openings 713 may become close to each other. As a result, the two contact openings 713 may be filled without any void formation near the bottom surfaces of the two contact openings 713. The yield of the semiconductor device 1A may be improved.

With reference to FIG. 24, a planarization process, such as chemical mechanical polishing, may be performed until the top surface of the second insulating layer 609 is exposed to remove excess material, provide a substantially flat surface for subsequent processing steps, and concurrently form the contacts 407 in the two contact openings 713. Specifically, the top segments 403T of the contact barrier layer 403, the adjustment layers 405 formed on the top surface of the second insulating layer 609, and portions of the layer of contact material 717 may be removed. The contact barrier layers 403, the adjustment layers 405, and the contacts 407 together form the two contact structures 401.

With reference to FIG. 5 and FIGS. 25 to 28, at step S25, capacitor structures 501 may be formed on the contacts 407.

Figure 25:
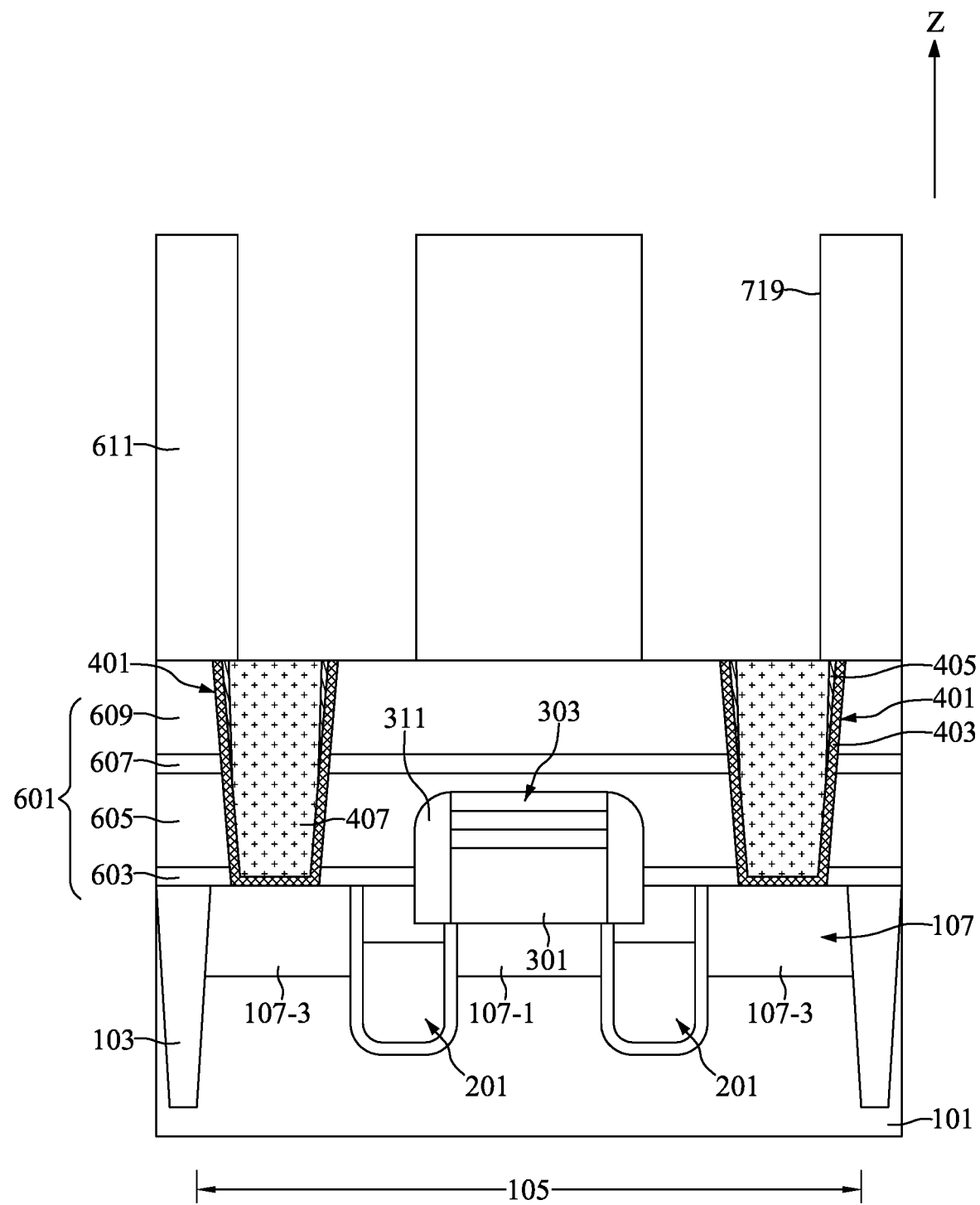

With reference to FIG. 25, a third insulating layer 611 may be formed on the second insulating layer 609 by a deposition process. A photolithography process may be performed to define positions of the capacitor structures 501. After the photolithography process, an etch process, such as an anisotropic dry etch process, may be performed to form a capacitor trenches 719 in the third insulating layer 611. The top surfaces of the two contact structures 401 may be exposed through the capacitor trenches 719.

Figure 26:
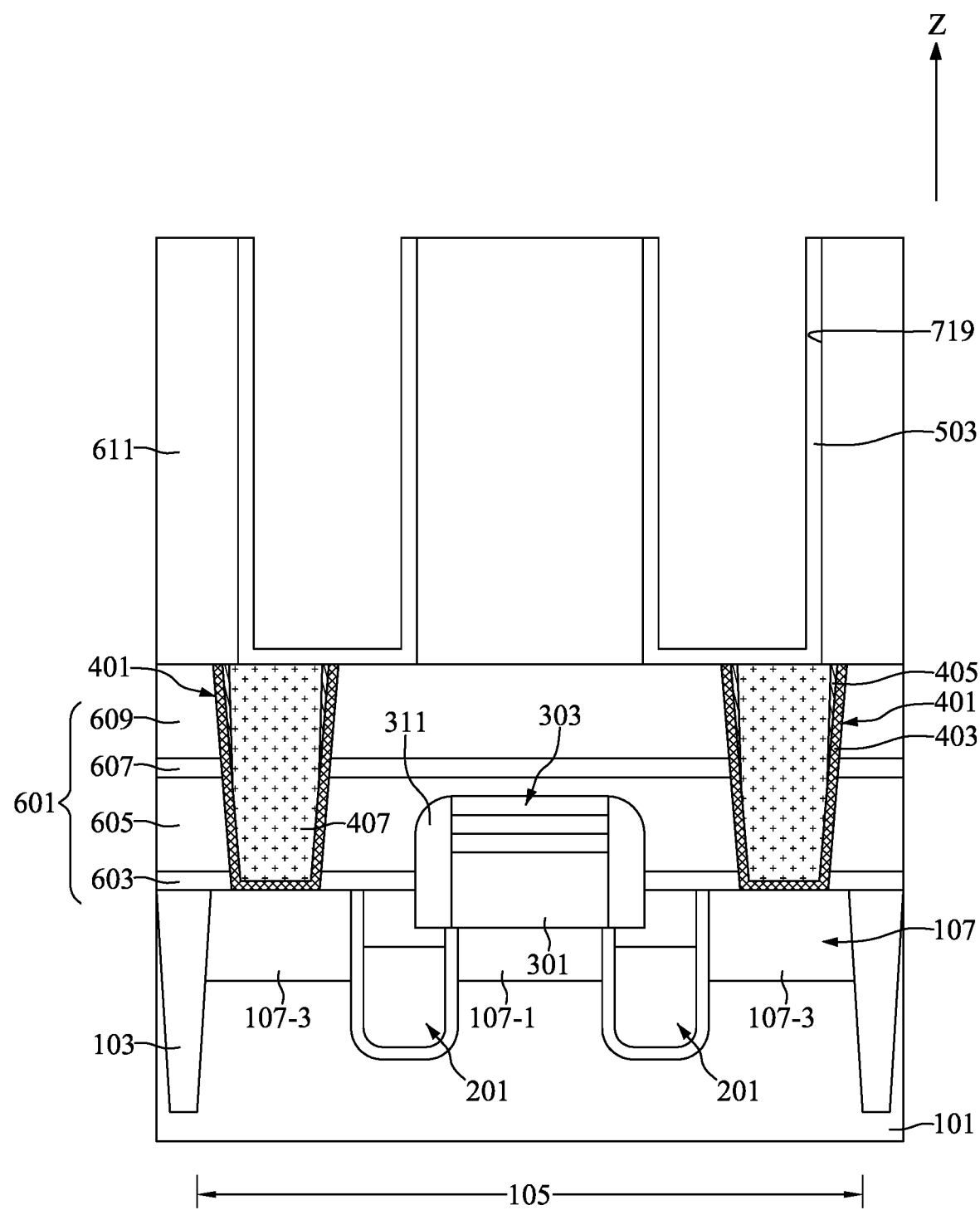

With reference to FIG. 26, capacitor bottom electrodes 503 may be respectively correspondingly formed in the capacitor trench 719.

Figure 27:
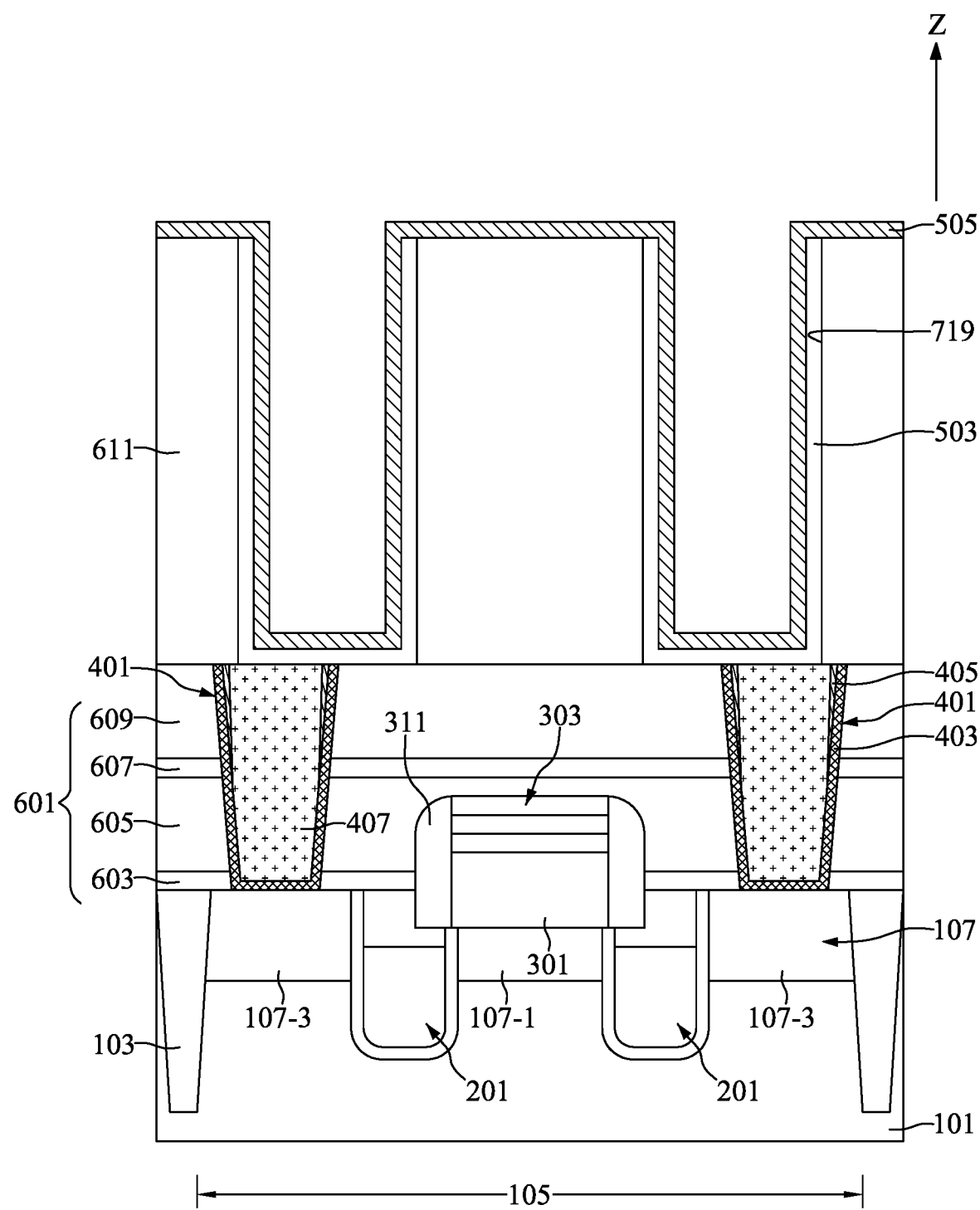

With reference to FIG. 27, a capacitor dielectric layer 505 may be formed on the capacitor bottom electrodes 503 in the capacitor trenches 719 and formed on the top surface of the third insulating layer 611.

Figure 28:
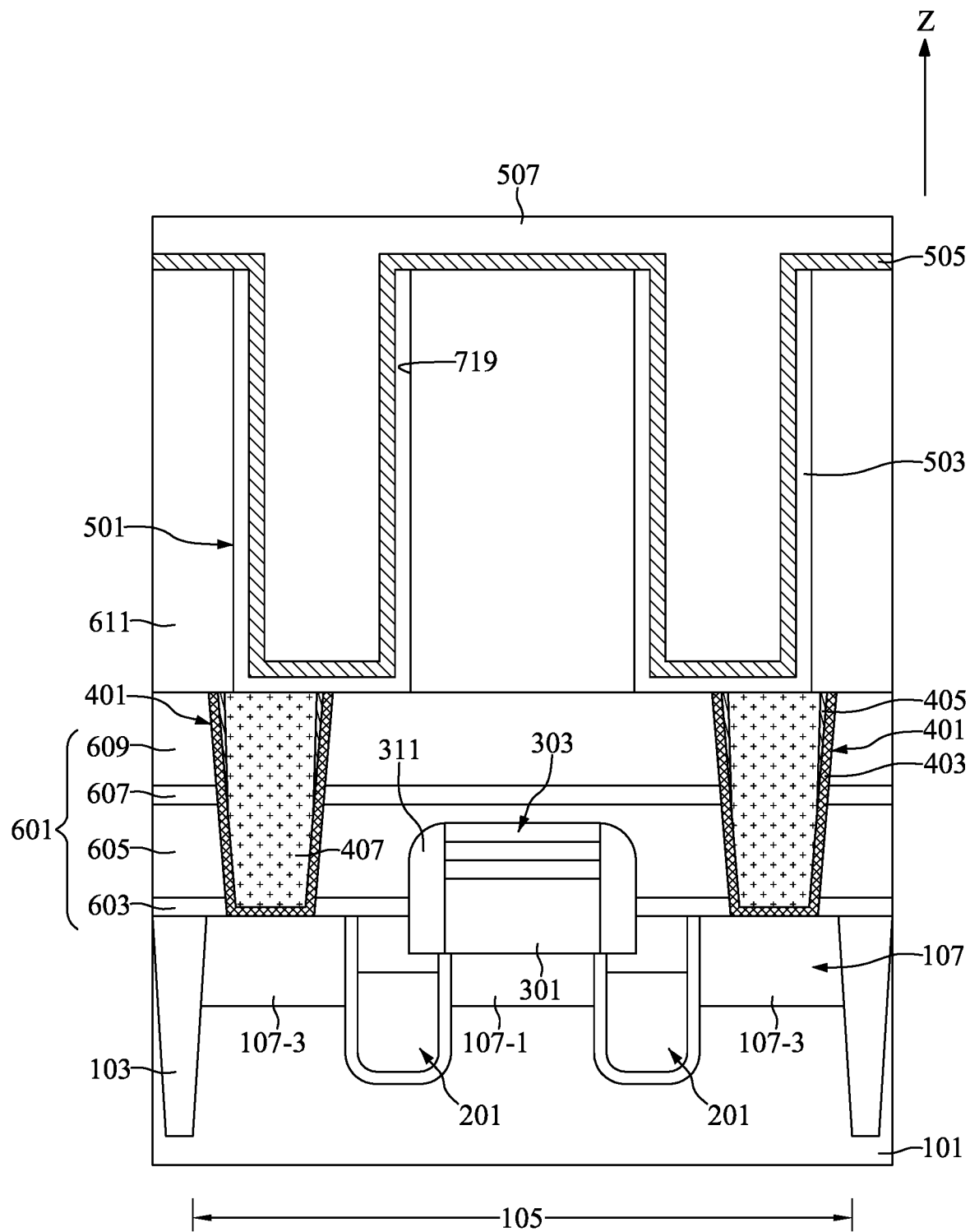

With reference to FIG. 28, a capacitor top electrode 507 may be formed on the capacitor dielectric layer 505 and may fill the capacitor trenches 719. The capacitor bottom electrodes 503, the capacitor dielectric layer 505, and the capacitor top electrode 507 together form the capacitor structures 501.

FIGS. 29 to 32 illustrate, in schematic cross-sectional diagrams, part of a flow of fabricating a semiconductor device 1C in accordance with another embodiment of the present disclosure.

Figure 29:
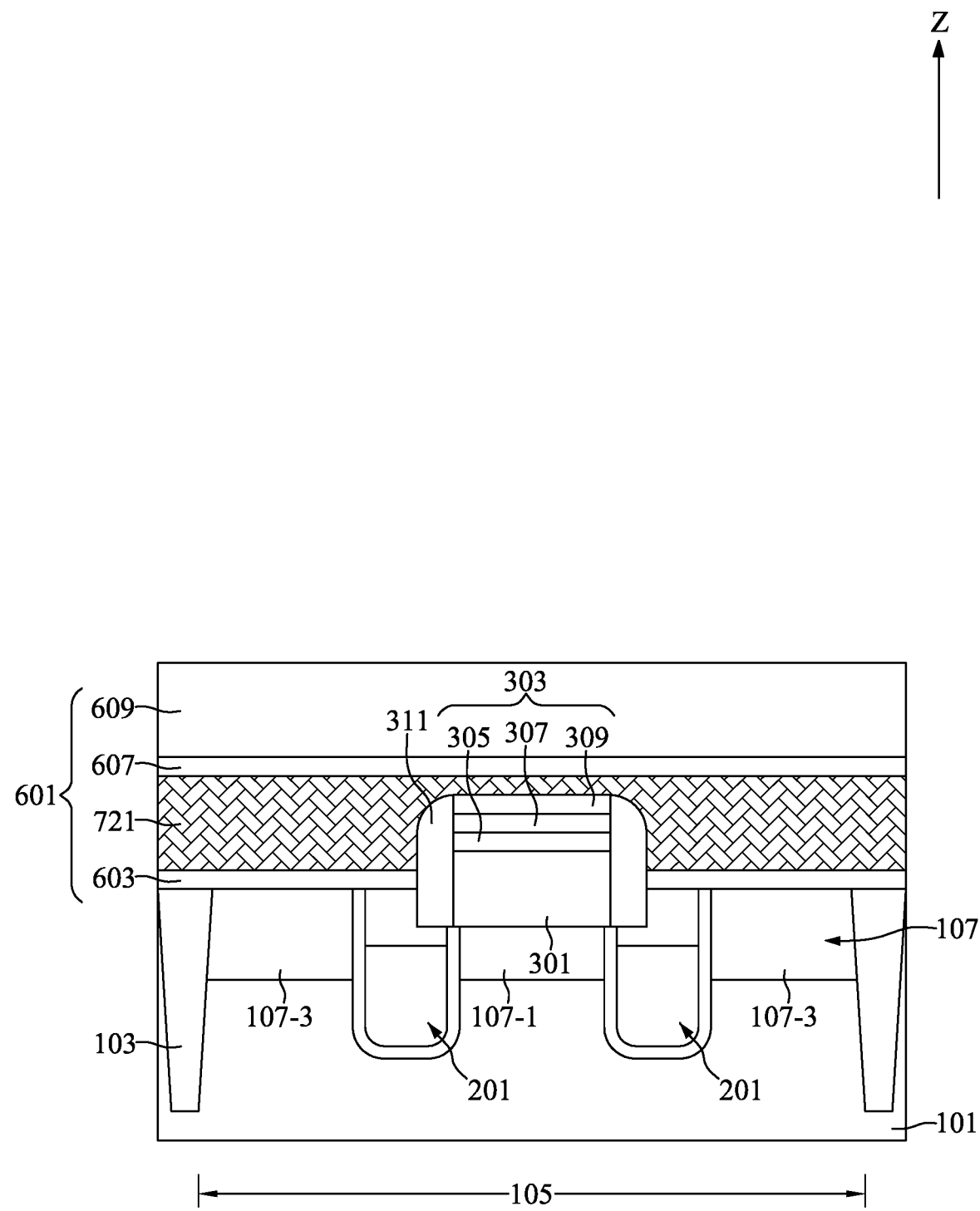
FIGS. 29 to 32 illustrate, in schematic cross-sectional diagrams, part of a flow of fabricating a semiconductor device in accordance with another embodiment of the present disclosure.

With reference to FIG. 29, an intermediate semiconductor device as illustrated in FIG. 16 may be fabricated. A layer of energy-removable material 721 may be formed on the first liner layer 603. The second liner layer 607 and the second insulating layer 609 may be sequentially formed on the layer of energy-removable material 721. The energy-removable material 721 may include a material such as a thermal decomposable material, a photonic decomposable material, an e-beam decomposable material, or a combination thereof. For example, the energy-removable material 721 may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material.

Figure 30:
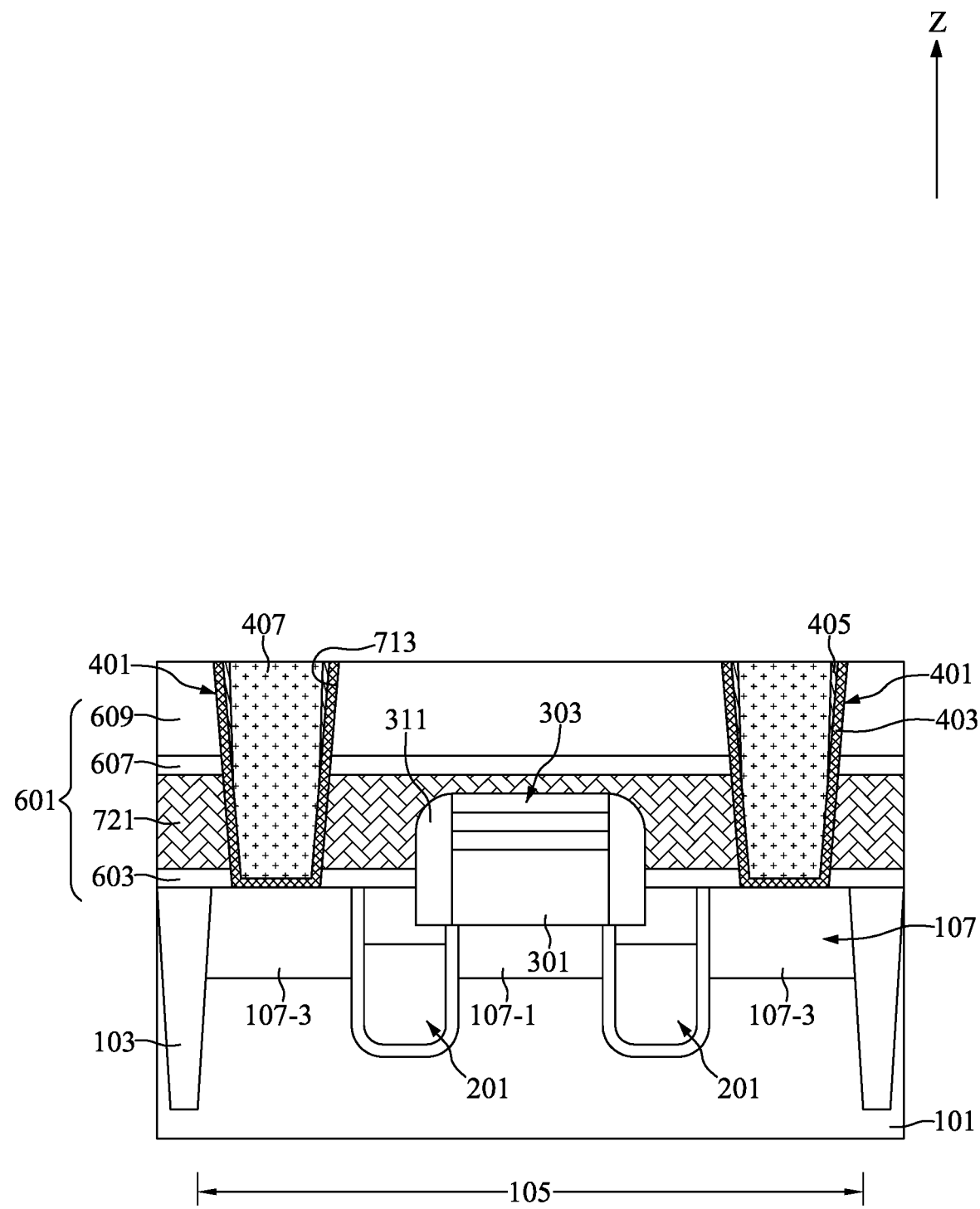

With reference to FIG. 30, the two contact structures 401 may be formed with a procedure similar to that illustrated in FIGS. 18 to 24.

Figure 31:
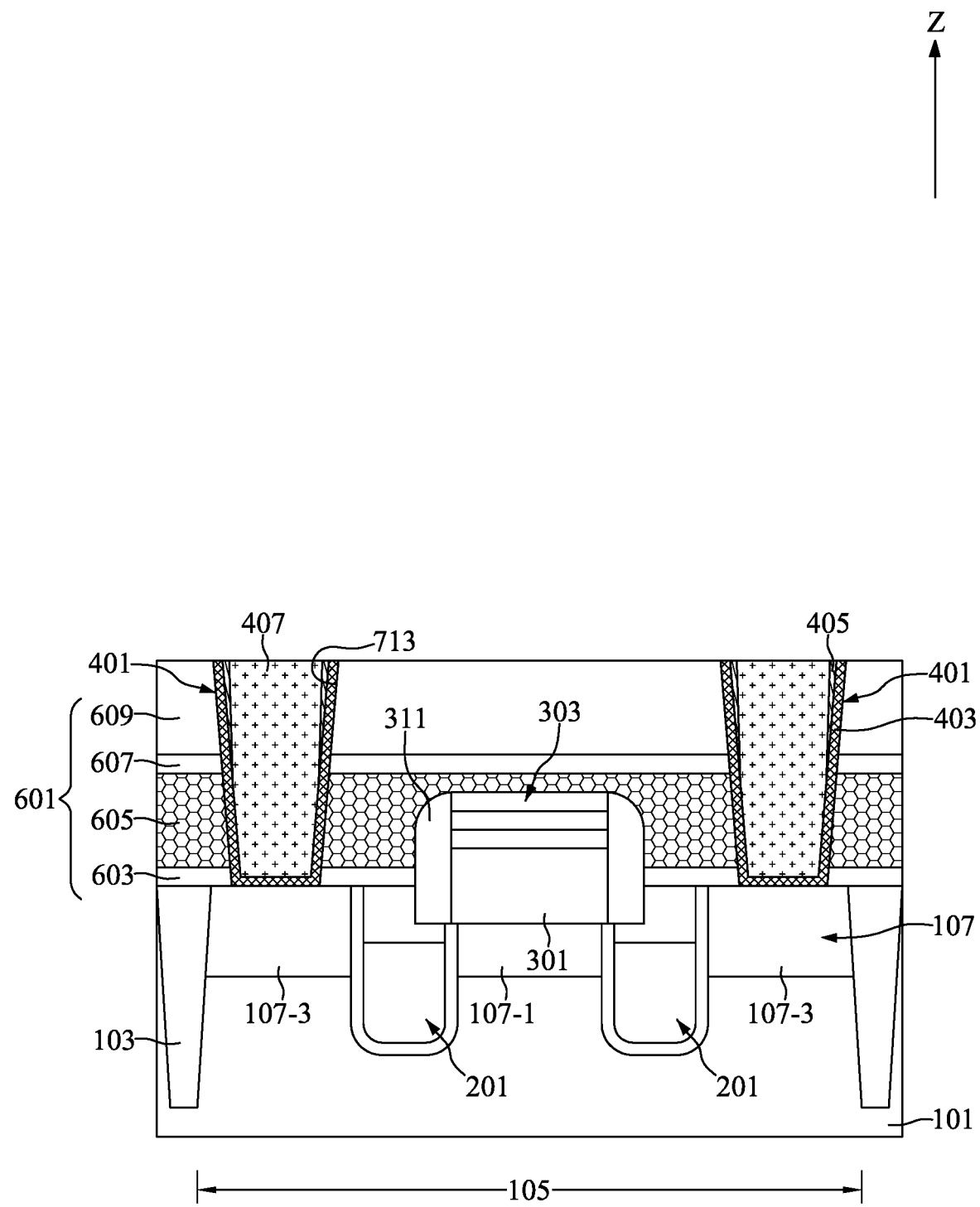

With reference to FIG. 31, an energy treatment may be performed to the intermediate semiconductor device illustrated in FIG. 30 by applying the energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. After the energy treatment, the layer of the energy-removable material 721 may turn into the first insulating layer 605. The first insulating layer 605 is porous.

Figure 32:
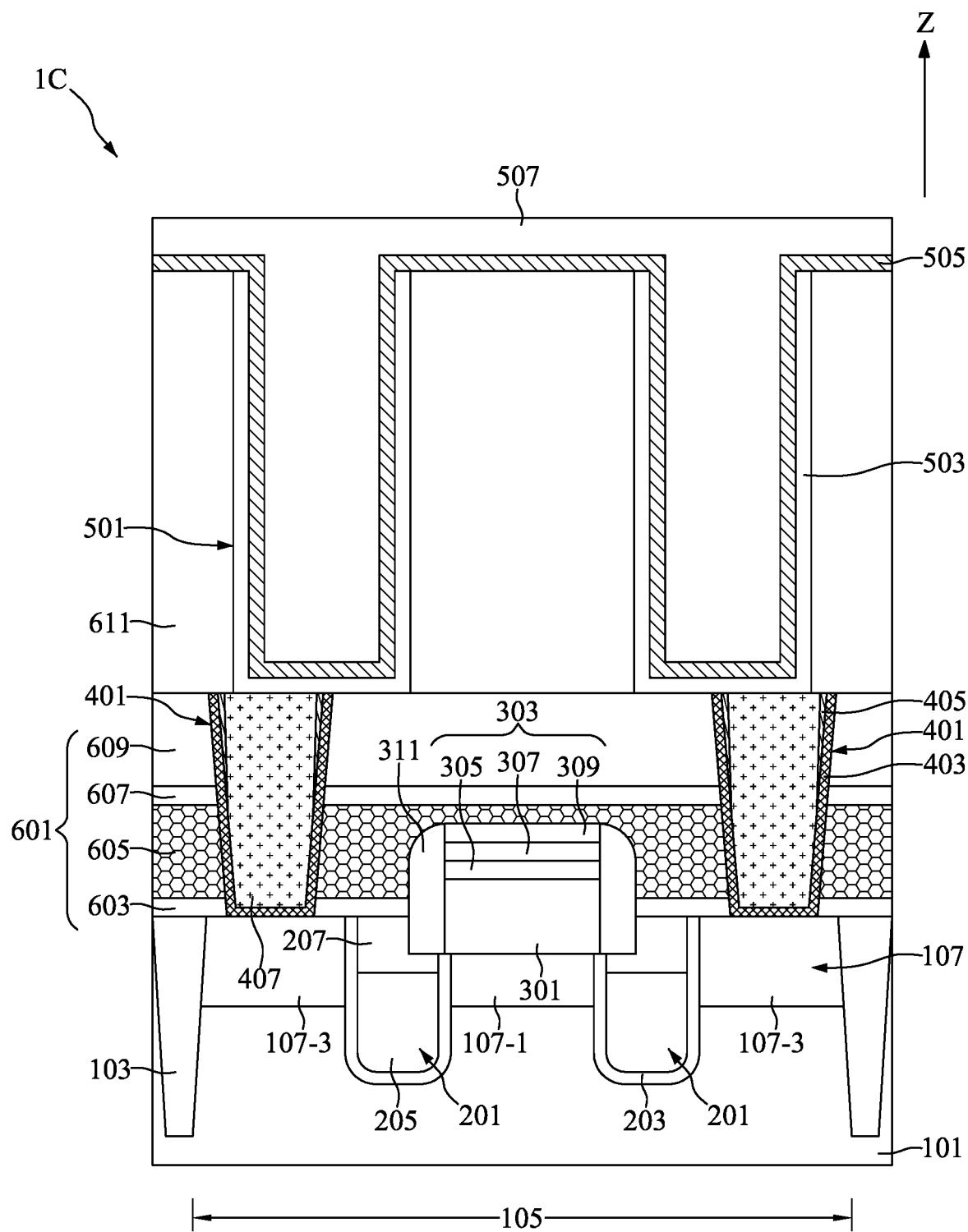

With reference to FIG. 32, the capacitor structures 501 and the third insulating layer 611 may be formed a procedure similar to that illustrated in FIGS. 25 to 28. In some embodiments, the energy treatment may be performed after the formation of the capacitor structures 501.

One aspect of the present disclosure provides a semiconductor device including a substrate, an interconnection structure positioned on the substrate, a contact positioned penetrating the interconnection structure, and two adjustment layers positioned on sidewalls of the contact.

Another aspect of the present disclosure provides a method for fabricating a semiconductor device including providing a substrate, forming an interconnection structure on the substrate, forming a contact opening penetrating the interconnection structure, conformally forming a contact barrier layer in the contact opening, conformally forming adjustment layers covering upper portions of the contact barrier layer, and forming a contact in the contact opening.

Due to the design of the semiconductor device of the present disclosure, the two contact structures 401 may be formed without any void. Therefore, the yield of the semiconductor device 1A may be improved. In addition, the porosity of the first insulating layer 605 may reduce the parasitic capacitance of the semiconductor device 1C.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming an interconnection structure on the substrate;
   forming a contact opening penetrating the interconnection structure;
   conformally forming a contact barrier layer in the contact opening, wherein the contact barrier layer has two side segments and a bottom segment;
   conformally forming an adjustment layer that covers an upper portion of the contact barrier layer, such that the bottom segment of the contact barrier layer is free from the adjustment layer, wherein a thickness of the adjustment layer is gradually reduced from top to bottom; and
   forming a contact in the contact opening, such that the adjustment layer is formed at an upper portion of a sidewall of the contact.

2. The method for fabricating the semiconductor device of claim 1, wherein the adjustment layer is formed of metal oxide, metal nitride, or metal carbide.

3. The method for fabricating the semiconductor device of claim 2, wherein the step of forming the interconnection structure on the substrate comprises:
   forming a first liner layer on the substrate;
   forming a layer of energy-removable material on the first liner layer;
   forming a second liner layer on the layer of energy-removable material; and
   forming a second insulating layer on the second liner layer;
   wherein the contact opening is formed penetrating the second insulating layer, the second liner layer, the layer of energy-removable material, and the first liner layer.

4. The method for fabricating the semiconductor device of claim 3, further comprising:
   performing an energy treatment to turn the layer of energy-removable material into a first insulating layer;
   wherein a porosity of the first insulating layer is between about 15% and about 50%.

5. The method for fabricating the semiconductor device of claim 4, wherein an energy source of the energy treatment is heat, light, or a combination thereof.

6. The method for fabricating the semiconductor device of claim 5, wherein the layer of energy-removable material comprises a base material and a decomposable porogen material.

7. The method for fabricating the semiconductor device of claim 1, wherein the adjustment layer is formed by:
   conformally forming the adjustment layer on the side segments and the bottom segment of the contact barrier layer; and
   performing an anisotropic etching process to remove the adjustment layer formed on the bottom segment of the contact barrier layer.

8. The method for fabricating the semiconductor device of claim 1, further comprising:
   performing a planarization process, such that a top surface of the contact barrier layer, a top surface of the adjustment layer, and a top surface of the contact are coplanar with a top surface of the interconnection structure.

9. The method for fabricating the semiconductor device of claim 3, wherein a bottom most point of the adjustment layer at a vertical level is not lower than a vertical level of the second liner layer.

* * * * *